United States Patent
Alrod et al.

(10) Patent No.: US 8,261,176 B2
(45) Date of Patent: Sep. 4, 2012

(54) POLYNOMIAL DIVISION

(75) Inventors: Idan Alrod, Herzliya (IL); Eran Sharon, Rishon Lezion (IL)

(73) Assignee: Sandisk IL Ltd., Kfar Saba (IL)

( * ) Notice: Subject to any disclaimer, the term of this patent is extended or adjusted under 35 U.S.C. 154(b) by 697 days.

(21) Appl. No.: 12/495,654

(22) Filed: Jun. 30, 2009

(65) Prior Publication Data
US 2010/0332956 A1 Dec. 30, 2010

(51) Int. Cl.
G06F 11/00 (2006.01)
G06F 7/22 (2006.01)
H03M 13/00 (2006.01)

(52) U.S. Cl. ........... 714/810; 708/650

(58) Field of Classification Search ........ 714/746, 714/757–758, 782, 784, 810, 819, 708, 492, 714/504, 650, 656
See application file for complete search history.

(56) References Cited

U.S. PATENT DOCUMENTS

| | | | | |
|---|---|---|---|---|
| 5,258,944 A | * | 11/1993 | Smith | 708/504 |
| 5,475,630 A | * | 12/1995 | Briggs et al. | 708/654 |
| 6,047,305 A | * | 4/2000 | Yano | 708/655 |
| 6,701,479 B2 | * | 3/2004 | Keller | 714/757 |
| 6,847,986 B2 | * | 1/2005 | Inui | 708/656 |
| 2002/0042804 A1 | | 4/2002 | Tezuka | |
| 2004/0083251 A1 | | 4/2004 | Geiringer et al. | |
| 2008/0040638 A1 | | 2/2008 | Goessel et al. | |

OTHER PUBLICATIONS

Kwon, Hyung-Joon et al. "A New Division Algorithm Based on Lookahead of Partial-Remainder (LAPR) for High-Speed/Low-Power Coding Applications," IEEE Transactions on Circuits and Systems—II: Analog and Digital Signal Processing, vol. 46, No. 2, pp. 202-209, Feb. 1999.

Bini, D. et al. "Fast Parallel Algorithms for Polynomial Division Over an Arbitrary Field of Constants," Comp. & Maths. with Appls., vol. 12A, No. 11, pp. 1105-1118, 1986.

Eberly, Wayne. "Very Fast Parallel Matrix and Polynomial Arithmetic," Department of Computer Science, University of Toronto, Canada, IEEE, 1984, pp. 21-30.

* cited by examiner

*Primary Examiner* — Shelly A Chase
(74) *Attorney, Agent, or Firm* — Toler Law Group, PC

(57) ABSTRACT

Systems and methods to perform polynomial division are disclosed. In a particular embodiment, the method includes receiving a codeword and storing a portion of the received codeword at a register. The portion of the received codeword has a first number of terms. A divisor having a second number of terms is also received. During at least one stage of a multi-stage polynomial division operation using the portion of the codeword and the divisor, the portion of the received codeword to be divided by the divisor is adjusted based on a result of a comparison of the first number to the second number.

44 Claims, 26 Drawing Sheets

POLYNOMIAL DIVISION

FIELD OF THE DISCLOSURE

The present disclosure is generally related to polynomial division.

BACKGROUND

Non-volatile semiconductor memory devices, such as removable storage cards or Universal Serial Bus (USB) flash memory devices, have enabled increased portability of data and software applications. Data storage densities of non-volatile semiconductor memory devices are generally increasing and support greater performance in portable electronic devices. Some features that enable higher density data storage, such as multi-level cell technologies, may also cause increased design complexity to maintain robust operation of the memory device.

Error detection and correction techniques are becoming more powerful to increase reliability of data retrieved from a memory device. For example, Bose-Chaudhuri-Hocquenghem (BCH) and Reed-Solomon (RS) encoders can detect and correct large numbers of errors using a technique largely based upon division in the finite Galois field $GF(2^k)$. Such division operations are conventionally based on long polynomial division and have a variety of applications, such as communications, optical disks, flash memories, portable equipment, and control and computer systems. However, conventional long polynomial division techniques may be limited by high latency. Another division technique with reduced latency has been proposed by use of large lookup tables corresponding to a predetermined divisor. However, such lookup tables impose additional design constraints and limit overall applicability to the specific data stored in the lookup tables.

SUMMARY

Methods and devices to perform efficient multi-stage polynomial division are disclosed. A multi-stage polynomial division operation processes a portion of a dividend each clock cycle of a processor to generate temporary remainder terms that may be applied to adjust a next portion of the dividend in a following clock cycle. The multi-stage polynomial division operation is adjustable to accommodate divisors having different numbers of terms.

Division of polynomials over a finite field $GF(2^k)$ may be performed by partitioning an n-degree polynomial representation $u(x)$ of a dividend into a group of lower m coefficients (i.e., having a degree of m−1), and k groups of equal length, where the length is designated as p. The polynomial representation of the dividend is thus a polynomial of degree given m+kp−1, where k is chosen to be the smallest number that satisfies m+kp−1≧n.

Division of the original n-degree polynomial $u(x)$ given by $u(x)+0x^{n+1}+\ldots+0x^{m+kp-1}$ may be performed by computing p elements of the quotient polynomial using one clock cycle. At each stage a temporary remainder polynomial of degree m−1, (i.e. m coefficients), is computed or updated. Thus, the quotient and the remainder of the division operation are computed in k steps. At the final stage of the multistage polynomial division operation, the temporary remainder polynomial holds the division remainder.

DETAILED DESCRIPTION

FIGS. 1-4 illustrate systems that may be used to perform polynomial division of a received sequence of values that may be expressed as a polynomial, such as a codeword that is received at an encoder or decoder for error detection and correction applications. The disclosed embodiments perform polynomial division of the received sequence using an iterative process that performs computations on sequential portions of the received sequence to generate a remainder value during each iteration. The remainder value generated during each iteration corresponds to a portion of the received sequence divided by a divisor, where the divisor may also be represented by a polynomial. The remainder values generated during each iteration are used to adjust a later portion of the received sequence. After iteratively processing each portion of the received sequence, a final remainder value represents the remainder of the entire sequence divided by the divisor.

The disclosed embodiments enable a multi-stage polynomial division operation that is generally adaptable to divisors of arbitrary size. To illustrate, when each iteration of the division operation processes a first number of terms, denoted p, of the received sequence and the divisor has a second number of terms, denoted m. Information is passed between successive iterations of the multi-stage polynomial division operation based on the relationship between p and m. For example, when m is greater than p, the m−p higher order remainder values are combined with remainder values generated during one or more prior iterations, while the p lower order remainder values are not combined with prior remainder values. Conversely, when p is greater than m, the m higher order terms of each portion of the sequence are adjusted based on remainder values generated during a prior iteration, while the p−m lower order terms are not adjusted. The mathematical foundations of the disclosed embodiments are described with respect to FIGS. 5-22, and methods of performing multi-stage polynomial division operation are described with respect to FIGS. 23-26.

Figure 1:
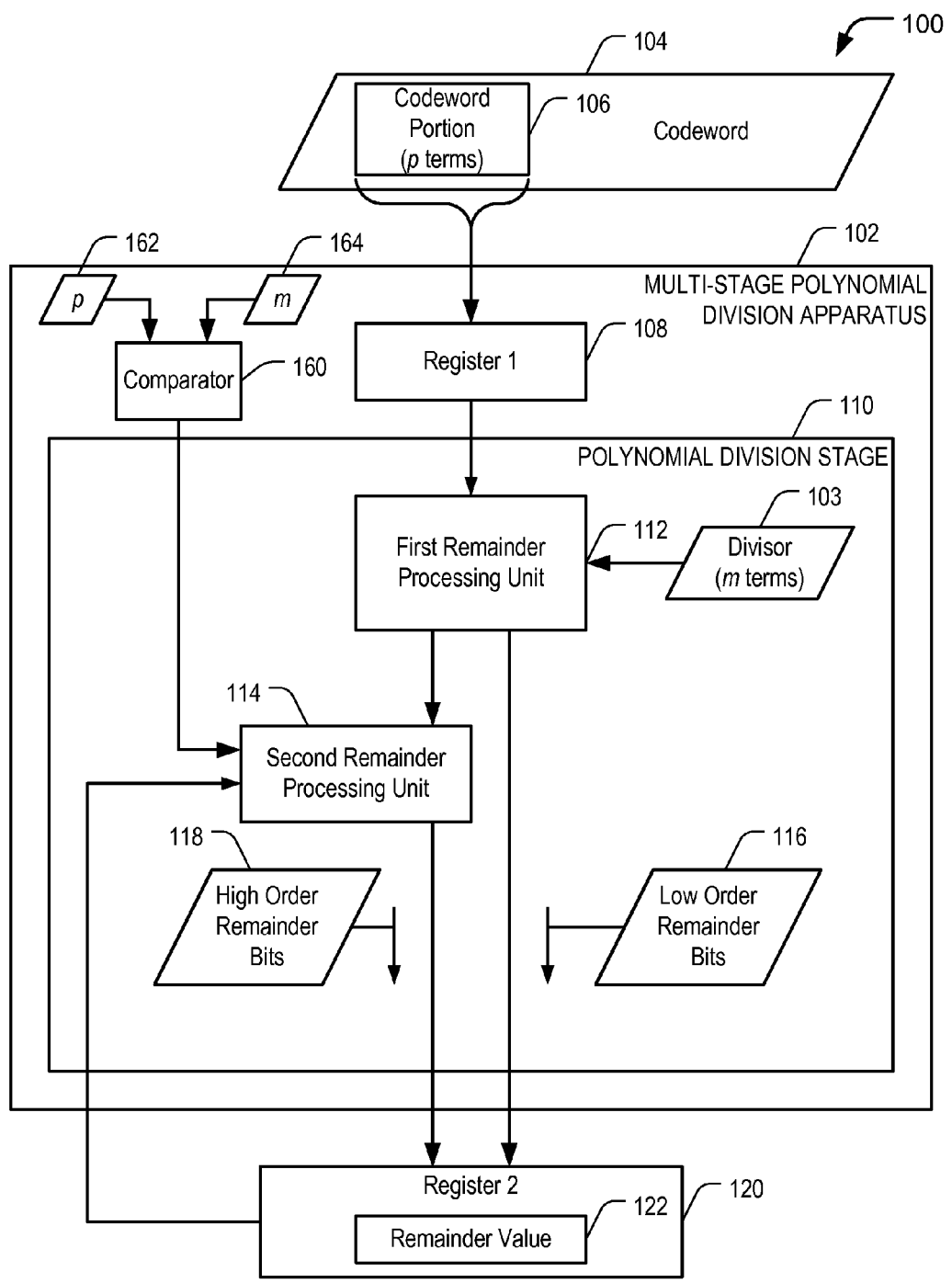
FIG. 1 is a block diagram of a first particular embodiment of a system including a multi-stage polynomial division apparatus.

Referring to FIG. 1, a block diagram of a first particular embodiment of a system 100 including a multi-stage polynomial division apparatus 102 is depicted. The multi-stage polynomial division apparatus 102 includes a first register 108, a first remainder processing unit 112, and a second remainder processing unit 114. The second remainder processing unit 114 is responsive to an output of a comparison logic module, such as a comparator 160. The first remainder processing unit 112 and the second remainder processing unit 114 are implemented in a polynomial division stage 110 that provides a remainder value 122 resulting from the polynomial division stage 110 to a second register 120.

The first register 108 is configured to at least temporarily store a portion 106 of a received codeword 104. The portion 106 of the received codeword 104 has a first number of terms (p) 162. The second register 120 is configured to store at least a portion of the remainder value 122 generated during at least one stage of the multi-stage polynomial division operation based on a value of a divisor 103. The divisor 103 has a second number of terms (m) 164.

The system 100 processes the received codeword 104 using the divisor 103 to perform each stage of the iterative multi-stage polynomial division operation according to the values of p and m, as described above. The polynomial division may determine the quotient polynomial $q(x)$ and the remainder $r(x)$ of $u(x)=q(x)g(x)+r(x)$, where $u(x)$ represents the dividend (the received codeword 104), $g(x)$ represents the divisor 103 (e.g., a generator function of an encoding operation) and $r(x)$ represents a remainder of the polynomial division operation. The multi-stage polynomial division apparatus 102 is configured to perform a series of polynomial division stages that have a cumulative effect of generating a remainder value that results from division of the codeword 104 by the divisor 103, such as will be described in further detail with respect to FIGS. 5-22.

The codeword 104 may be operated upon in successive portions, such as the representative portion 106. At each iteration or stage of execution of the multi-stage polynomial division operation, a next portion of the codeword is read from the first register 108 may be adjusted based on content of the second register 120 that was generated during a prior iteration of the division operation, such as will be described with respect to FIG. 2. Although the multi-stage polynomial division apparatus 102 is depicted as receiving a codeword 104, it should be understood that embodiments of the present disclosure are generally applicable to any application that may benefit from polynomial division. The codewords depicted in FIGS. 1-4, including the codeword 104, represent any sequence of values that can be represented in polynomial form and therefore should not be interpreted as limiting any of the systems depicted in FIGS. 1-4 to encoding and decoding implementations.

During at least one stage of the multi-stage polynomial division operation, the first remainder processing unit 112 is operable to perform low order bit processing to produce a low order bit remainder output 116 and the second remainder processing unit 114 is operable to perform high order bit processing to produce a high order bit remainder output 118. The first remainder processing unit 112 may be programmed to implement matrix or polynomial operations on a received input to generate an output that corresponds to a remainder of a division operation using the divisor 103. For example, in embodiments where an adjustment unit adjusts the portion 106 of the codeword 104 based on values at the second register 120, such as will be described with respect to FIG. 2, the first remainder processing unit 112 may be configured or programmed to perform computations on the adjusted portion of the codeword that generate a remainder resulting from dividing the adjusted codeword portion by the divisor 103.

The comparator 160 is configured to perform a comparison of the first number p 162 and the second number m 164. The comparison may be performed each time a value of the divisor 103 is received to enable reconfiguration of the multi-stage polynomial division apparatus 102 to perform a division operation using the received divisor 103. A result of the comparison is provided to the second remainder processing unit 114.

The second remainder processing unit 114 is configured to add at least one value of the high order bit remainder output 118 to a value stored in the second register 120 when the second number is greater than the first number (i.e., m>p). To illustrate, when the power of the divisor 103 (i.e., m 164) expressed in polynomial form is greater than the number of terms (i.e., p 162) operated on from the first register 108, the first remainder processing unit 112 may generate a remainder output having the second number of terms m 164. The first number p 162 of low-order bits, illustrated as the low-order remainder bits 116, may be written directly to the second register 120. However, the second remainder processing unit 114 may add the remaining high order remainder bits generated by the first remainder processing unit 112 to values stored in the second register 120 in a polynomial addition operation to generate the high order remainder bits 118 that are written to the second register 120 and that may be used in a next iteration of the multi-stage polynomial division operation, as will be further described with respect to FIG. 5.

The system 100 enables efficient polynomial division to be performed by effectively processing the first number of terms p 162 in parallel during each iteration or division stage without placing a restriction on the divisor 103 to have a number of terms m 164 based on the first number of terms p 162. As a result, the system 100 enables a flexible implementation of high-speed polynomial division that may have many useful applications. For example, the first remainder processing unit 112 and the second remainder processing unit 114 may be embedded within a controller of a non-volatile memory device, such as to enable syndrome encoding or other error detection and correction systems. As another example, the first remainder processing unit 112 and the second remainder processing unit 114 may be embedded within an encoder of a data communication system, such as a wireless communication system, as part of an encoding system to enable transmission error detection and data recovery. In another example, the first remainder processing unit 112 and the second remainder processing unit 114 may be embedded within a decoder of a secure processor, such as a cryptographic processor that operates using factors of large numbers.

Figure 2:
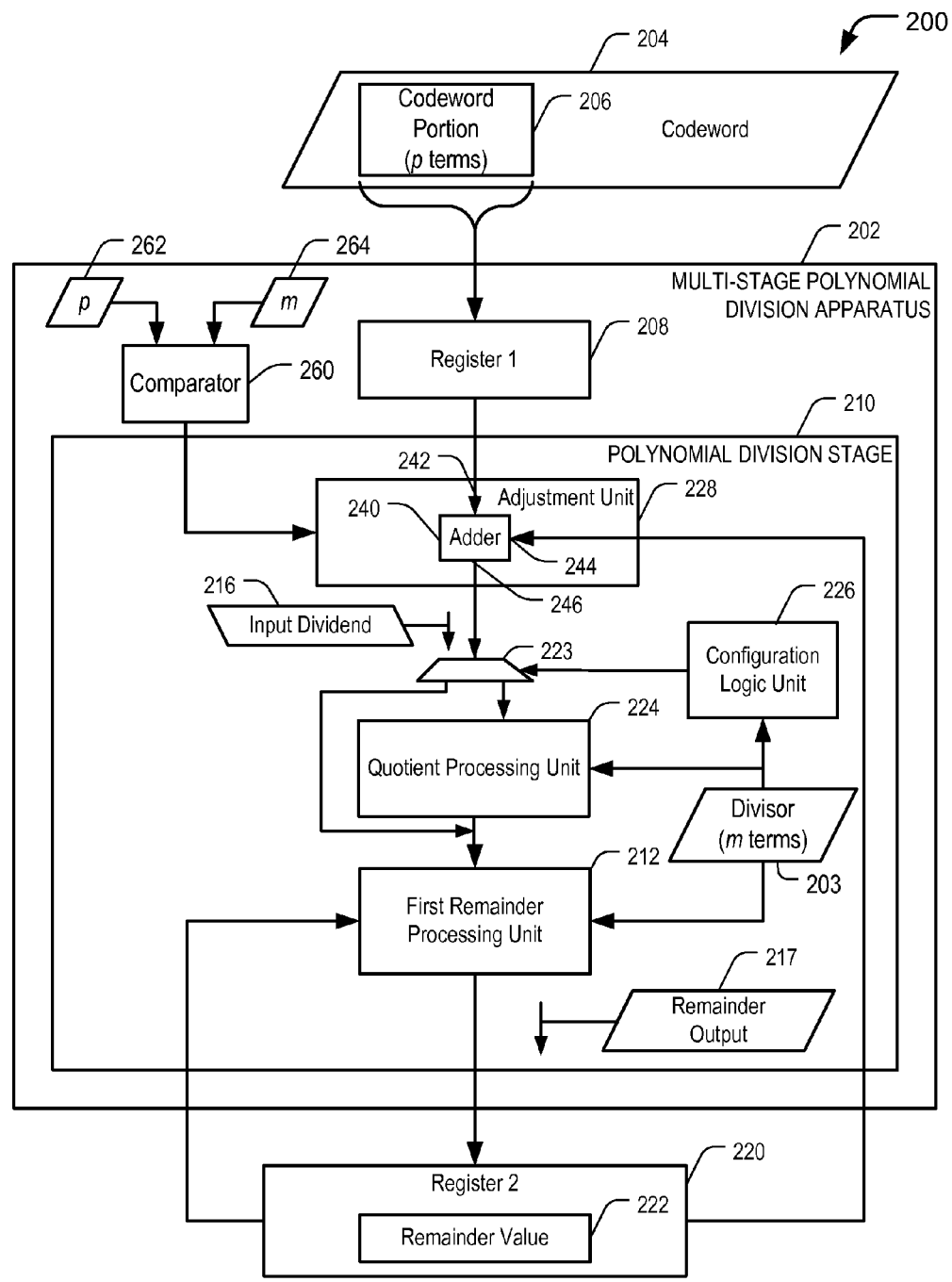
FIG. 2 is a block diagram of a second particular embodiment of a system including a multi-stage polynomial division apparatus.

FIG. 2 is a block diagram of a second particular embodiment of a system 200 including a multi-stage polynomial division apparatus 202. The multi-stage polynomial division apparatus 202 includes a first register 208, a comparison logic module such as a comparator 260, and a first remainder processing unit 212. The first register 208 may correspond to the first register 108 of FIG. 1, the comparator 260 may correspond to the comparator 160 of FIG. 1, and the first remainder processing unit 212 may correspond to the first remainder processing unit 112 of FIG. 1. The first remainder processing unit 212 is implemented in a polynomial division stage 210 that also includes an adjustment unit 228, a switching element 223, a quotient processing unit 224, and a configuration logic unit 226. The polynomial division stage 210 provides a remainder output 217, resulting from operation of the polynomial division stage 210, to a remainder value 222 stored at a second register 220. The multi-stage polynomial division apparatus 202 may correspond to an implementation of the multi-stage polynomial division apparatus 102 of FIG. 1 that is configurable to operate in a first operating mode or a second operating mode at least partially based on a value of a divisor 203 of the division operation.

The first register 208 is configured to at least temporarily store a portion 206 of a received codeword 204. The portion 206 of the received codeword 204 has a first number of terms p 262. The second register 220 is configured to store the remainder value 222 generated during at least one stage of the multi-stage polynomial division operation based on a value of the divisor 203. The divisor 203 has a second number of terms m 264.

The multi-stage polynomial division apparatus 202 is configured to perform a series of polynomial division stages that have a cumulative effect of generating a remainder value that results from division of the codeword 204 by the divisor 203, such as will be described with respect to FIGS. 5-22. The codeword 204 may be operated upon in successive portions, such as the representative portion 206. At each iteration or stage of execution of the division operation, a next portion of the codeword is read from the first register 208 and may be adjusted based on content of the second register 220 that was generated during a prior iteration.

The adjustment unit 228 is responsive to the output of the comparator 260 and configured to selectively adjust at least part of the value retrieved from the first register 208 to generate an input dividend 216 to be processed at the quotient processing unit 224. The input dividend 216 represents the portion 206 of the codeword 204 adjusted based on values stored at the second register 220. For example, the adjustment unit 228 may include an adder 240 coupled to the first register 208 via a first input 242 and to the second register 220 via a second input 244, and may have an output 246 coupled to provide the input dividend 216 to at least one of the first remainder processing unit 212 and the quotient processing unit 224 via the switching element 223. The adder 240 may be configured to perform addition according to an underlying finite field. For example, the adder 240 may be configured to perform addition modulo 2 corresponding to the field GF(2), such as by performing a bitwise exclusive-OR (XOR) operation.

The adder 240 may be configured to adjust the portion 206 of the received codeword 204 with values from the second register 220 based on the comparison of the first number p 262 representing the first number of terms to the second number m 264 representing the second number of terms. For example, the adjustment unit 228 may configure the adder 240 to add a first portion of the remainder value 222 to each of the terms of the portion 206 of the received codeword 204 when the first number p 262 is less than or equal to the second number m 264 (i.e., m≧p). The adjustment unit 228 may configure the adder 240 to add a second portion of the remainder value 222 to at least one but less than all of the terms of the portion 206 of the received codeword 204 when the first number p 262 is greater than the second number m 264 (i.e., p>m). For example, when p>m, the adder 240 may adjust m of the most significant terms of the portion 206 of the received codeword 204 but may not adjust the remaining p−m least significant terms.

The quotient processing unit 224 is programmable to perform arithmetic operations on a portion of the received codeword that has been adjusted by the adjustment unit 228 (e.g. the input dividend 216). The arithmetic operations performed by the quotient processor unit 224 are generated based on the value of the divisor 203. For example, the quotient processing unit 224 may be adapted to perform a partial quotient determination operation of the codeword 204 based on the divisor value using the input dividend 216 received from the adjustment unit 228. The quotient processing unit 224 generates an output that corresponds to a subset of the terms of a quotient polynomial q(x) that are calculated during a particular iteration stage of the polynomial division operation. As will be described with respect to FIG. 5, the quotient polynomial q(x) satisfies the equation u(x)=q(x)g(x)+r(x), where u(x) represents the dividend (the received codeword 204), g(x) represents the divisor 203 (e.g., a generator function of an encoding operation) and r(x) represents a remainder of the polynomial division operation.

The configuration logic unit 226 is adapted to determine whether to operate in a first operating mode or a second operating mode at least partially based on the value of the divisor 203. In the first operating mode the adjusted portion of the codeword (e.g., the input dividend 216) is received at the quotient processing unit 224 and an output of the quotient processing unit 224 is provided to the first remainder processing unit 212. In the second operating mode the quotient processing unit 224 is bypassed and the adjusted portion of the codeword (e.g. the input dividend 216) is provided to the first remainder processing unit 212. The configuration logic circuit 226 may configure a data processing path by providing a control signal to the switching element 223, schematically illustrated as a multiplexor.

Figure 6:
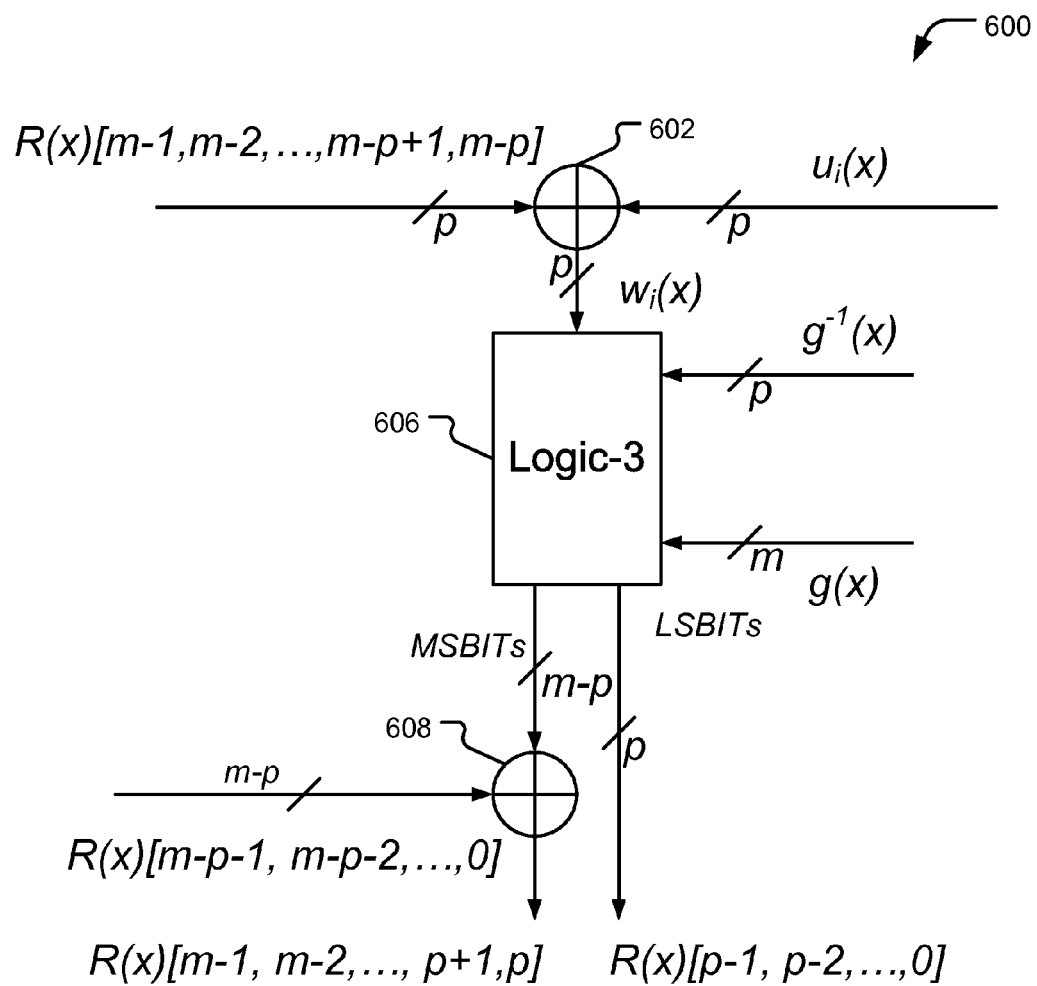
FIG. 6 is a block diagram of a second particular embodiment of a system configured to perform multi-stage polynomial division when a number of terms of a divisor is greater than a number of dividend terms evaluated during a division stage.

The configuration logic unit 226 may determine whether to operate in the first operating mode or the second operating mode according to one or more criteria, as described with respect to FIG. 6. For example, the configuration logic unit 226 may be responsive to a sparseness of a matrix representation of values based on the divisor value. In addition, or alternatively, the configuration logic unit 226 may be adapted to determine whether to operate in the first operating mode or the second operating mode at least partially based on whether parallel processing is available and based on a parallel complexity of operation in the first operating mode as compared to the second operating mode.

The first remainder processing unit 212 is adapted to generate a remainder output 217 representing a remainder of a division operation that uses the divisor 203. In the first operating mode, the first remainder processing unit 212 is configured or programmed to perform arithmetic operations using the output of the quotient processing unit 224 to generate the remainder output 217. In the second operating mode, the first remainder processing unit 212 is configured or programmed to perform arithmetic operations on the input dividend 216 to generate the remainder output 217. Configuration of the first remainder processing unit 212 to operate in the first and second operating modes is described further with respect to FIGS. 5 and 6.

The second register 220 is coupled to receive and store at least a portion the remainder output 217. For example, when the first number p 262 is greater than or equal to the second number m 264, the entire remainder output 217 may be stored in the second register 220. In an implementation where the first number p 262 can be less than the second number m 264, such as described with respect to FIG. 1, one or more most significant bits of the remainder output 217 may be adjusted based on values stored at the second register 220. The adjustment to the most significant bits of the remainder output 2167 may be performed at a second remainder processing unit (not shown) that is similar to the second remainder processing unit 114 of FIG. 1.

During operation, the divisor 203 may be received at the multi-stage polynomial division apparatus 202 to be used to process one or more received codewords 204. The configuration logic unit 226 may perform one or more computations to determine whether to operate in the first operating mode or the second operating mode based on the value of the divisor 203. For example, where the quotient processing unit 224 and the first remainder processing unit 212 perform matrix operations, the configuration logic unit 226 may select the operating mode based on a sparseness of the matrices that would be individually applied by the quotient processing unit 224 and the first remainder processing unit 212 in the first operating mode as compared to the product of the matrices that would be applied by the first remainder processing unit 212 in the second operating mode.

The first remainder processing unit 212, and optionally the quotient processing unit 224, are programmed to implement appropriate operations according to the selected operating mode based on the value of the divisor 203, as will be described with respect to FIG. 3. The adjustment unit 228 may also be configured for operation according to the number of terms m 264 of the divisor 203 as compared to the size p 262 of the codeword portion 206 to be processed during the iterative stages. After configuration is complete, a first stage of the multi-stage polynomial division operation may commence using the received codeword 204 and based on the received divisor value, as will be described with respect to FIGS. 5-22.

The multi-stage polynomial division apparatus 202 may be implemented using various physical component architectures. For example, the quotient processing unit 224, the first remainder processing unit 212, and the configuration logic unit 226 may be implemented via hardware elements, such as within an integrated circuit. Alternatively, or in addition, one or more of the quotient processing unit 224, the first remainder processing unit 212, and the configuration logic unit 226 may be implemented using one or more processors, such as one or more digital signal processors (DSPs), that are programmed to perform the specific operations attributed to the corresponding components.

For ease of explanation, the configuration logic unit 226 is depicted providing a control signal to the switching element 223. However, in other implementations, the quotient processing unit 224 may be powered down in the second operating mode or may be configured to enter a pass-though mode where the quotient processing unit 224 remains in the data processing path but performs no operations on the input dividend 216.

Figure 3:
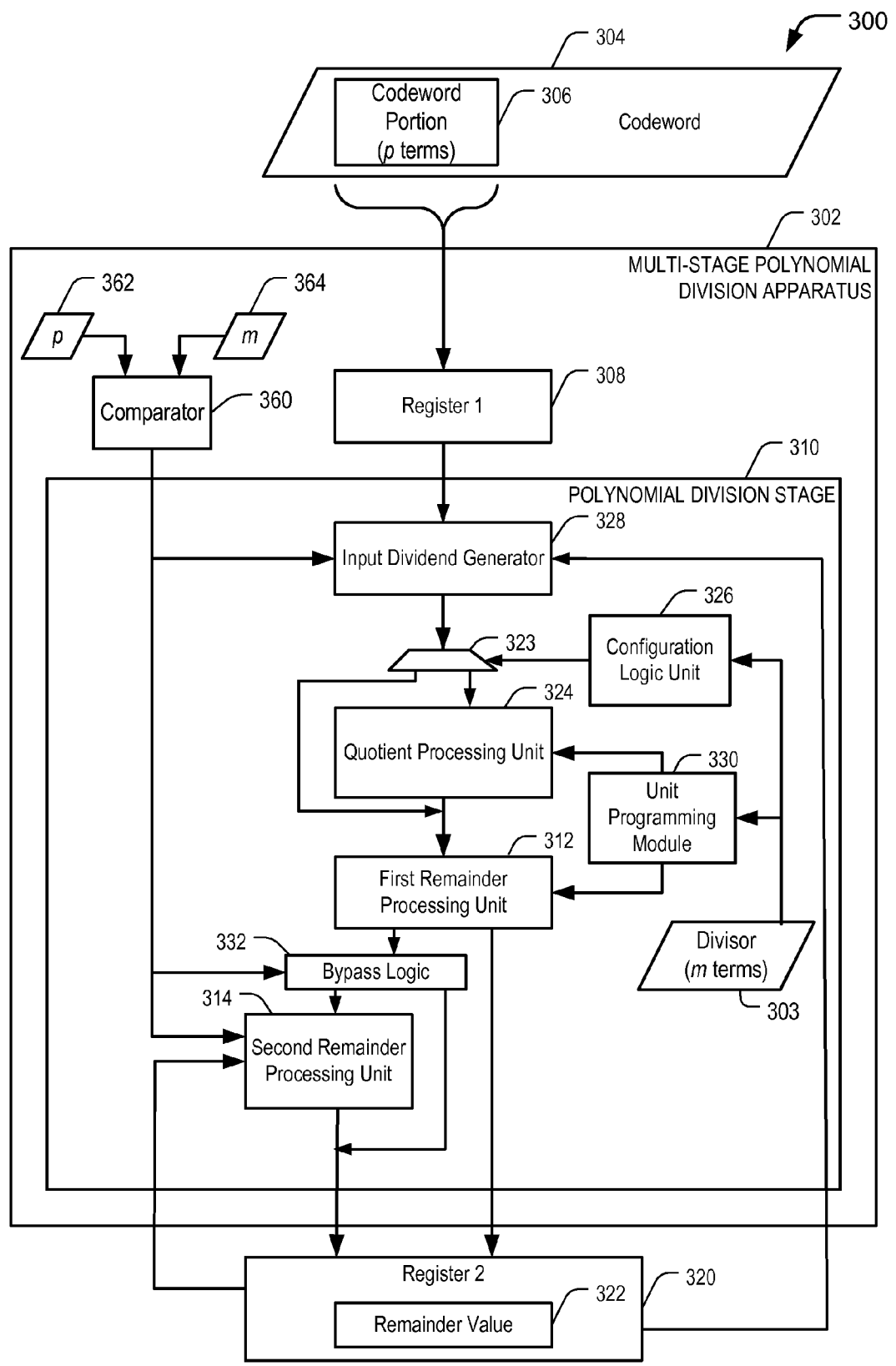
FIG. 3 is a block diagram of a third particular embodiment of a system including a multi-stage polynomial division apparatus.

FIG. 3 is a block diagram of a third particular embodiment of a system 300 including a multi-stage polynomial division apparatus 302. The multi-stage polynomial division apparatus 302 includes a first register 308, a comparison logic module such as a comparator 360, an input dividend generator 328, a switching element 323 coupled to a configuration logic unit 326, a quotient processing unit 324, a first remainder processing unit 312, and a second remainder processing unit 314. A polynomial division stage 310 includes a unit programming module 330 coupled to the quotient processing unit 324 and to the first remainder processing unit 312. A bypass logic element 332 is coupled to an output of the first remainder processing unit 312 to selectively bypass processing at the second remainder processing unit 314 in certain situations. Components of the system 300 may operate in a similar manner as corresponding components of the system 100 of FIG. 1 and the system 200 of FIG. 2.

The polynomial division stage 310 provides a remainder output resulting from the polynomial division stage 310 as a remainder value 322 stored at a second register 320. The multi-stage polynomial division apparatus 302 may correspond to an implementation of the multi-stage polynomial division apparatus 102 of FIG. 1 or 202 of FIG. 2 that is configurable to operate in a first operating mode or a second operating mode at least partially based on a value of a divisor 303 of the division operation and that is also configurable to conduct iterative division operation stages when the portion 306 of the received codeword 304 has a first number of terms p 362 that is greater than, less than, or equal to a second number of terms m 364 of the divisor 303.

The multi-stage polynomial division apparatus 302 is configured to perform a series of polynomial division stages that have a cumulative effect of generating a remainder value that results from division of the codeword 304 by the divisor 303, such as will be described with respect to FIGS. 5-22. The codeword 304 may be operated upon in successive portions, such as the representative portion 306. At each iteration or stage of execution of the division operation, a next portion of the codeword 304 is loaded to the first register 308 and adjusted at the input dividend generator 328 based on content of the second register 320 that was generated during a prior iteration.

The unit programming module 330 is responsive to the value of the divisor 303 and is adapted to program at least one of the quotient processing unit 324 and the first remainder processing unit 312 without performing a lookup operation to retrieve stored data corresponding to the divisor value. The unit programming module 330 may be responsive to or interoperate with the configuration logic unit 326 to program the first remainder processing unit 312 and optionally to program the quotient processing unit 324 based on the operating mode selected by the configuration logic unit 326. For example, in a polynomial-based implementation, in the first operating mode, the quotient processing 324 unit may be programmed to implement a first set of polynomial operations and the first remainder processing unit 312 may be programmed to implement a second set of polynomial operations, while in the second operating mode the first remainder processing unit 312 may be programmed to implement a third set of polynomial operations. In a matrix-based implementation, in the first operating mode the quotient processing unit 324 may be programmed to implement a first matrix operation and the first remainder processing unit 312 may be programmed to implement a second matrix operation, while in the second operating mode the first remainder processing unit 312 may be programmed to implement a third matrix operation. Programming of the first remainder processing unit 312 and the quotient processing unit 324 is described with respect to FIGS. 5-10.

The input dividend generator 328 may include a first adder (not shown), such as the adder 240 of FIG. 2, coupled to the first register 308 and the second register 320 to selectively add values from the second register 320 to corresponding values from the first register 308 to generate an input dividend. The input dividend generator 328 is responsive to an output of the comparator 360. For example, when the first number of terms p 362 of the portion 306 of the codeword 304 is less than or equal to the second number of terms m 364 of the divisor 303, each value of the portion 306 of the received codeword 304 may be adjusted by adding a corresponding value from the second register 320. Alternatively, when the first number of terms p 362 of the portion 306 of the codeword 304 is greater than the second number of terms m 364 of the divisor 303, one or more most significant values (e.g. the m most significant values) of the portion 306 of the codeword 304 may be adjusted but the remaining lower-order values are not adjusted (e.g., the p−m least significant values are unchanged).

The quotient processing unit 324 is programmed by the unit programming module 330 to generate an output representing a number of terms of a quotient polynomial, such as described with respect to the quotient processing unit 224 of FIG. 2, in the first mode of operation. In the second mode of operation, the data processing path bypasses the quotient processing unit 324 via operation of the switching element 323 controlled by the configuration logic unit 326. The first remainder processing unit 312 is programmed by the unit programming module 330 to generate low order remainder values and high order remainder values, such as described with respect to the first remainder processing unit 112 of FIG. 1.

The bypass logic element 332 is responsive to the comparator 360 and configured to selectively bypass high order remainder bit processing at the second remainder processing unit 314 when the first number of terms p 362 of the input dividend is less than or equal to the second number of terms m 364 of the divisor 303. The second remainder processing unit 314 is configured to adjust high-order remainder values received from the first remainder processing unit 312, as described with respect to the first remainder processing unit 112 of FIG. 1. For example, the second remainder processing unit 314 may include a second adder (not shown) having a first input coupled to at least a portion of an output of the first remainder processing unit 312, a second input coupled the second register 320, and an output coupled to the second register 320. The second adder may be configured to perform addition in a finite field, such as via a bitwise XOR operation in the field GF(2).

By programming the first remainder processing unit 312 and the quotient processing unit 324 based on the selected mode of operation without using a lookup table of values based on a particular divisor, the system 300 enables operating flexibility for a range of divisor values without requiring large data storage capacity for the lookup table. In addition, operation of the input dividend generator 328 based on a comparison of the size p 362 of the codeword portion 306 and the number of divisor terms m 364, and also operation of the bypass logic element 332 to selectively remove the second remainder processing unit 314 from the data processing path based on the comparison, enables operating flexibility for divisor values that have a number of terms m that is greater than, less than, or equal to the size p of the portion 306 of the received codeword 304.

Figure 4:
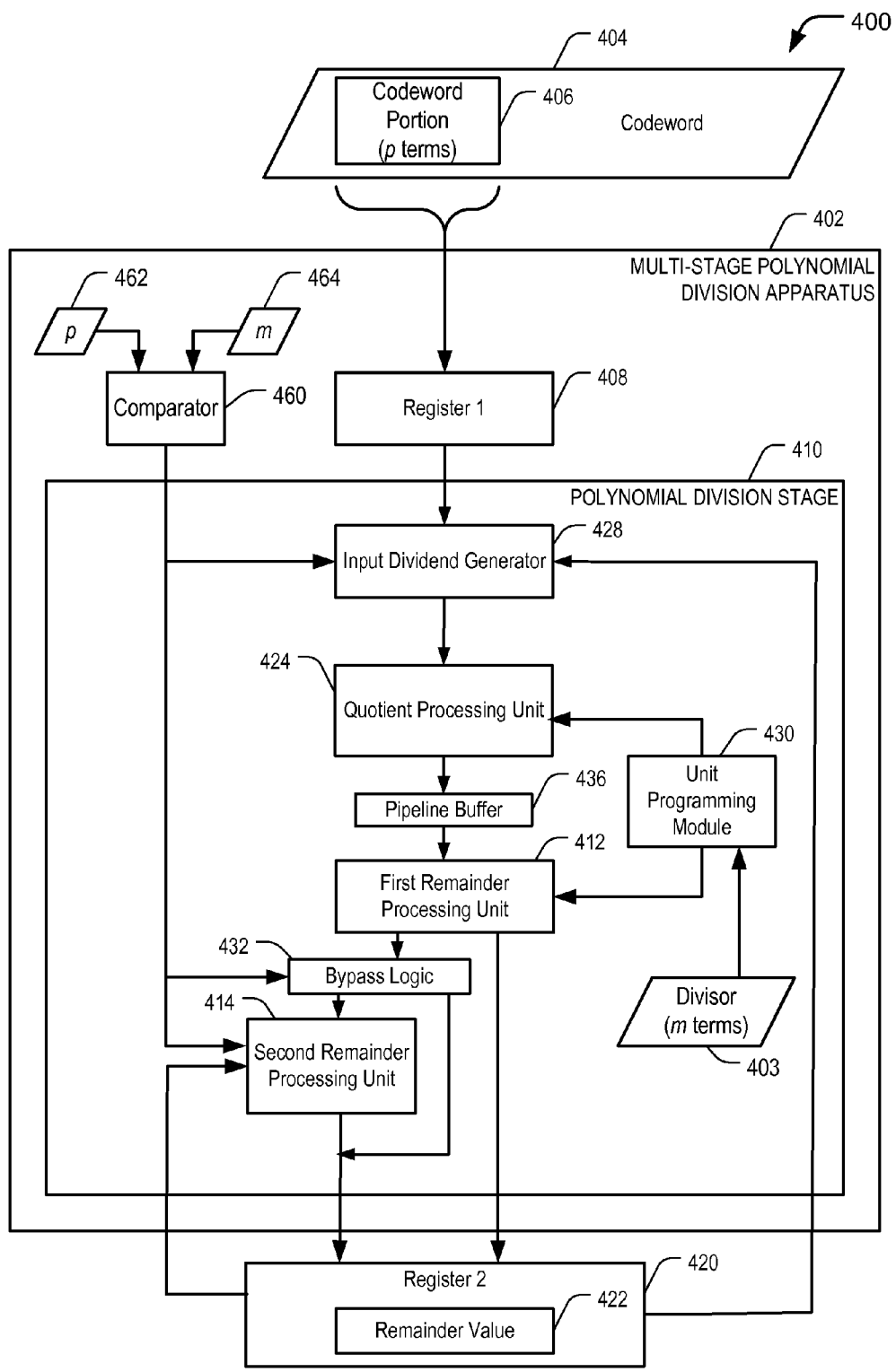
FIG. 4 is a block diagram of a fourth particular embodiment of a system including a multi-stage polynomial division apparatus.

FIG. 4 is a block diagram of a fourth particular embodiment of a system 400 including a multi-stage polynomial division apparatus 402. The multi-stage polynomial division apparatus 402 includes a first register 408, a comparison logic module such as a comparator 460, an input dividend generator 428, a quotient processing unit 424, a unit programming module 430, a first remainder processing unit 412, a bypass logic element 432, and a second remainder processing unit 414 that operate in a substantially similar manner as corresponding components of the system 300 of FIG. 3. The system 400 also includes a second register 420 that corresponds to the second register 320 of FIG. 3 and that stores a remain der value 422. The multi-stage polynomial division apparatus 402 also includes a pipeline buffer 436 to enable pipelined operation of the polynomial division stage 410. The multi-stage polynomial division apparatus 402 is configurable to perform division operations based on a number of terms p 462 of a portion 406 of a received codeword 404 as compared to a number of terms m 464 of a received divisor 403.

The pipeline buffer 436 is coupled to receive an output of the quotient processing unit 424 during a first pipeline cycle and to provide the output of the quotient processing unit 424 to the first remainder processing unit 412 during a subsequent pipeline cycle. For example, the pipeline buffer 436 may be implemented as a set of latches, flip flop elements, or similar devices. As will be described with respect to FIGS. 11-22, the pipeline architecture of the system 400 enables efficient concurrent processing of remainder terms of one iteration and quotient terms of a next iteration during a single pipeline cycle or clock cycle of a multi-cycle division operation. The pipeline architecture of the system 400 may relax restrictions due to propagation delay and routing during a single clock cycle.

FIGS. 5-26 depict various embodiments of systems and methods that may be implemented by one or more of the systems of FIGS. 1-4. As previously discussed, division of polynomials over a finite field $GF(2^k)$ is performed by partitioning an n-degree dividend polynomial u(x) into a group of first lower m coefficients (i.e., having a degree of m−1), and k groups of equal length designated as p. The dividend polynomial is thus a polynomial of degree given by Eq. (1):

$$m+kp-1 \tag{1}$$

In Eq. (1), k is chosen to be the smallest number that satisfies Eq. (2):

$$m+kp-1 \geq n \tag{2}$$

The original n-degree polynomial u(x) is given by Eq. (3):

$$u(x)+0 \cdot x^{n+1}+\ldots+0 \cdot x^{m+kp-1} \tag{3}$$

Division of the polynomial u(x) is performed by computing p elements of the quotient polynomial using one clock cycle. At each stage a temporary remainder polynomial of degree m−1, (i.e. m coefficients), is computed or updated, thus the quotient and the remainder of the division operation are computed in k steps. At the final stage the temporary remainder polynomial holds the division remainder.

For a given pair of polynomials u(x), g(x), of degrees n and m respectively, the object is to find polynomials q(x), r(x) satisfying Eq. (4):

$$u(x)=q(x)g(x)+r(x) \tag{4}$$

In Eq. (4), the degree of the remainder is less than a degree of the divisor, i.e., deg(r(x))<deg(g(x)).

According to a conventional process of solving the division problem for u(x), the highest coefficient of q(x), $q_{n-m}$, may be identified and associated with a monomial $q_{n-m}x^{n-m}$. A next step in the computation is given by Eq. (5):

$$u_1(x)=u(x)-q_{n-m}x^{n-m}g(x) \tag{5}$$

In Eq. (5), $u_1(x)$ is a polynomial of degree n−1. At this point, $u_1(x)$ is regarded as a polynomial of degree n−1 even if $u_{n-1}=0$. In case $u_{n-1}=0$, the corresponding q coefficient will also satisfy $q_{n-m-1}=0$.

Applying the same method to $u_1(x)$ yields a coefficient $q_{n-m-1}$, a monomial $q_{n-m-1}x^{n-m-1}$, and a polynomial $u_2(x)=u_1(x)-q_{n-m-1}x^{n-m-1}g(x)$, where the degree of the polynomial $u_2(x)$ is n−2.

After repeating the same computation for n−m+1 iterations, a result is obtained as given by Eq. (6):

$$r(x) = u_{n-m+1}(x) = u_{n-m}(x) - q_0 g(x) \tag{6}$$

$$q(x) = \sum_{i=0}^{n-m} q_i x^i$$

According to the present disclosure, parallel computing of p bits of the quotient is performed during each iteration of a division process.

A process for computing p bits of the quotient during each iteration of a division operation may be derived from an algebraic statement of the problem. In stating the problem, a given matrix G is associated with the polynomial g(x) and the vector u. Unknown vectors q and r may be solved according to Eq. (7):

$$u=Gq+r \tag{7}$$

By representing the matrix G and the polynomial g(x), Eq. (7) may be expressed in the form of Eq. (8):

$$\begin{bmatrix} u_0 \\ u_1 \\ u_2 \\ \vdots \\ \vdots \\ \vdots \\ \vdots \\ \vdots \\ \vdots \\ u_{n-p+1} \\ \vdots \\ u_{n-1} \\ u_n \end{bmatrix} = \begin{bmatrix} g_0 & 0 & \vdots & \vdots & \vdots & \vdots & \vdots & 0 \\ g_1 & g_0 & 0 & \vdots & \vdots & \vdots & \vdots & 0 \\ g_2 & g_1 & g_0 & 0 & \vdots & \vdots & \vdots & \vdots \\ \vdots & g_2 & g_1 & g_0 & \vdots & \vdots & \vdots & \vdots \\ \vdots & \vdots & g_2 & g_1 & \vdots & \vdots & \vdots & \vdots \\ \vdots & \vdots & \vdots & \vdots & \vdots & \vdots & \vdots & \vdots \\ g_m & g_{m-1} & g_{m-2} & \vdots & \vdots & \vdots & \vdots & 0 \\ 0 & g_m & g_{m-1} & g_{m-2} & \vdots & \vdots & \vdots & g_0 \\ \vdots & 0 & g_m & g_{m-1} & \vdots & \vdots & \vdots & g_1 \\ \vdots & \vdots & 0 & g_m & \vdots & \vdots & \vdots & \vdots \\ \vdots & \vdots & \vdots & 0 & \vdots & g_m & \vdots & g_{m-p+2} & g_{m-p+1} \\ \vdots & \vdots & \vdots & \vdots & \vdots & 0 & \vdots & \vdots \\ \vdots & \vdots & \vdots & \vdots & \vdots & \vdots & 0 & g_m & g_{m-1} \\ 0 & \vdots & \vdots & \vdots & \vdots & \vdots & \vdots & 0 & g_m \end{bmatrix} \cdot \begin{bmatrix} q_0 \\ q_1 \\ q_2 \\ \vdots \\ \vdots \\ \vdots \\ q_{n-m-p+1} \\ \vdots \\ q_{n-m-1} \\ q_{n-m} \end{bmatrix} + \begin{bmatrix} r_0 \\ r_1 \\ \vdots \\ \vdots \\ \vdots \\ \vdots \\ r_{m-1} \\ 0 \\ 0 \\ \vdots \\ \vdots \\ \vdots \\ 0 \end{bmatrix} \quad \text{Eq. (8)}$$

For multiple choices of p, this matrix equation may be solved in ~(n−m)/p iterations. It is assumed that n=m+kp−1, which can be achieved by identifying the polynomial u(x) with the polynomial given by Eq. (9):

$$u(x)+0\cdot x^{n+1}+\ldots+0\cdot x^{m+kp-1} \quad (9)$$

In a first iteration, the last 'p' rows of the matrix equation of Eq. (8) may be reduced to the equation given by Eq. (10):

$$\begin{bmatrix} u_{n-p+1} \\ \vdots \\ u_{n-1} \\ u_n \end{bmatrix} = \begin{bmatrix} g_m & \vdots & g_{m-p+2} & g_{m-p+1} \\ 0 & \vdots & \vdots & \vdots \\ \vdots & \vdots & g_m & g_{m-1} \\ 0 & \vdots & 0 & g_m \end{bmatrix} \begin{bmatrix} q_{n-m-p+1} \\ \vdots \\ q_{n-m-1} \\ q_{n-m} \end{bmatrix} \quad (10)$$

Denoting a p×p lower right corner of the matrix G by $G_p$ and denoting the vector of p highest coefficients of u and q by $u_p$ and $q_p$, respectively, Eq. (10) may be written in the form given by Eq. (11):

$$u_p = G_p q_p \quad (11)$$

Solving for $q_p$, the equation given by Eq. (11) may be rewritten in as expression given by Eq. (12):

$$q_p = G_p^{-1} u_p, \quad (12)$$

In Eq. (12), $G_p^{-1}$ is an upper triangular Toeplitz matrix and can therefore be associated with a polynomial $g^{-1}(x)$. The polynomial $g^{-1}(x)$ is a pseoudoinverse of the divisor polynomial $g(x)$. A relationship between the polynomials $g(x)$ and $g^{-1}(x)$ is given by Eq. (13):

$$g(x)*g^{-1}(x) = x^{m+p-1} + h(x) \quad (13)$$

with h(x) a polynomial of degree at most m−1.

Another notation for the matrices $G_p$ and $G_p^{-1}$ based on the polynomial origins of each is given by Eq. (14):

$$G_p = g(x)|_{p\, MSBits}$$

$$G_p^{-1} = g^{-1}(x)|_{p\, MSBits} \quad (14)$$

After solving and substituting for $q_p$ the value of r may be given by Eq. (15):

$$r = G\tilde{q}_p \quad (15)$$

In Eq. (15), by reuse of notation, $\tilde{q}_p$ denotes a vector of length n−m whose last p coordinates are the coordinates of $q_p$.

For actual computation, one should note that only the last m+p rows and last p columns of matrix G are relevant for generating the last m+p coefficients of r in computing the product of Eq. (15). However, the last p coefficients of r are known to be the last p coefficients of u as described with reference to Eq. (11). Thus, one may compute only m coefficients, which would include a product of an m×p matrix with a p dimensional vector. The product of an m×p may be written as given by Eq. (16):

$$r_m = G_m q_p \quad (16)$$

A matrix representation of Eq. (16) results in the equation of Eq. (17):

$$\begin{bmatrix} r_0 \\ r_1 \\ r_2 \\ \vdots \\ \vdots \\ \vdots \\ \vdots \\ \vdots \\ r_{m-2} \\ r_{m-1} \end{bmatrix} = \begin{bmatrix} g_0 & 0 & 0 & \vdots & \vdots & \vdots & \vdots \\ g_1 & g_0 & 0 & 0 & \vdots & \vdots & \vdots \\ g_2 & g_1 & g_0 & 0 & 0 & \vdots & \vdots \\ \vdots & \vdots & \vdots & \vdots & \vdots & \vdots & \vdots \\ g_{p-2} & \vdots & \vdots & \vdots & g_1 & g_0 & \vdots \\ g_{p-1} & g_{p-2} & \vdots & \vdots & g_2 & g_1 & g_0 \\ g_p & g_{p-1} & g_{p-2} & \vdots & \vdots & g_2 & g_1 \\ \vdots & \vdots & \vdots & \vdots & \vdots & \vdots & \vdots \\ \vdots & \vdots & \vdots & \vdots & \vdots & \vdots & \vdots \\ g_{m-2} & g_{m-3} & \vdots & \vdots & g_{m-p+1} & g_{m-p} & g_{m-p-1} \\ g_{m-1} & g_{m-2} & g_{m-3} & \vdots & \vdots & g_{m-p+1} & g_{m-p} \end{bmatrix} \cdot \begin{bmatrix} q_0 \\ q_1 \\ q_2 \\ \vdots \\ \vdots \\ \vdots \\ \vdots \\ q_{p-2} \\ q_{p-1} \end{bmatrix} \quad \text{Eq. (17)}$$

The first iteration may be concluded by eliminating the last p rows of u, q, and r, and erasing the last p rows and columns of matrix G. At the end of the iteration the p new coefficients of q are stored along with the m new coefficients of r. No other coefficients of r are used and may be discarded.

In each of the next k−1 iterations, an equation is computed as given by Eq. (18):

$$q_p = G_p^{-1}(u_p + r_p) \quad (18)$$

In Eq. (18), $r_p$ denotes the p MSB coordinates of $r_m$. After computing Eq. (18), new $r_m$ coefficients are computed. The first calculation in computing the $r_m$ coefficients involves solving the expression given by Eq. (19):

$$\tilde{r}_m = G_m q_p, \quad (19)$$

The values of $r_m$ may be computed from the equation given by Eq. (20):

$$r_m = r_m + \tilde{r}_m \quad (20)$$

The addition of Eq. (20) may be performed by adding (e.g. in the finite field $GF(2^k)$) the m−p LSB-s of the former coefficients of $r_m$ to the m−p MSB-s of the new values of $\tilde{r}_m$, where LSB-s denote the coefficients associated with the lower powers of the polynomial and MSB-s denote the coefficients associated with the higher powers of the polynomial. The p LSB-s are taken directly from the p LSB-s of $\tilde{r}_m$.

The new $r_p$ for the next iteration may be defined by taking the p MSB coordinates of $r_m$. Recalling the notation of Eq. (14) and defining $w_p = u_p + r_p$, Eq. (18) may be written as given by Eq. (21):

$$w_p \cdot g^{-1}(x)|_{p\, MSBits} = q_p \quad \text{Eq. (21)}$$

$$w_p \cdot g^{-1}(x) \cdot g(x)|_{p\, MSBits} = q_p \cdot g(x)|_{p\, MSBits} = w_p$$

The computation of $g^{-1}(x)|_{p\ MSBits} = G_p^{-1}$ may be solved in a straightforward manner by solving the following matrix equation given by Eq. (22):

$$\begin{bmatrix} g_m & g_{m-1} & g_{m-2} & \cdots & \cdots & g_{m-p+2} & g_{m-p+1} \\ 0 & g_m & g_{m-1} & \cdots & \cdots & g_{m-p+3} & g_{m-p+2} \\ 0 & 0 & g_m & \cdots & \cdots & \cdots & g_{m-p+3} \\ \vdots & 0 & 0 & g_m & \vdots & \vdots & \vdots \\ \vdots & \vdots & 0 & \vdots & \vdots & \vdots & \vdots \\ \vdots & \vdots & \vdots & \vdots & \vdots & \vdots & \vdots \\ \vdots & \vdots & \vdots & \vdots & g_{m-2} & \vdots & \vdots \\ \vdots & \vdots & \vdots & \vdots & g_{m-1} & g_{m-2} & \vdots \\ 0 & 0 & \vdots & \vdots & g_m & g_{m-1} & \vdots \\ 0 & 0 & 0 & \vdots & \vdots & 0 & g_m \end{bmatrix} \cdot \begin{bmatrix} g_0^{-1} \\ g_1^{-1} \\ g_2^{-1} \\ \vdots \\ \vdots \\ \vdots \\ \vdots \\ g_{p-3}^{-1} \\ g_{p-2}^{-1} \\ g_{p-1}^{-1} \end{bmatrix} = \begin{bmatrix} 0 \\ 0 \\ 0 \\ \vdots \\ \vdots \\ \vdots \\ \vdots \\ 0 \\ 0 \\ 1 \end{bmatrix} \quad \text{Eq. (22)}$$

Figure 5:
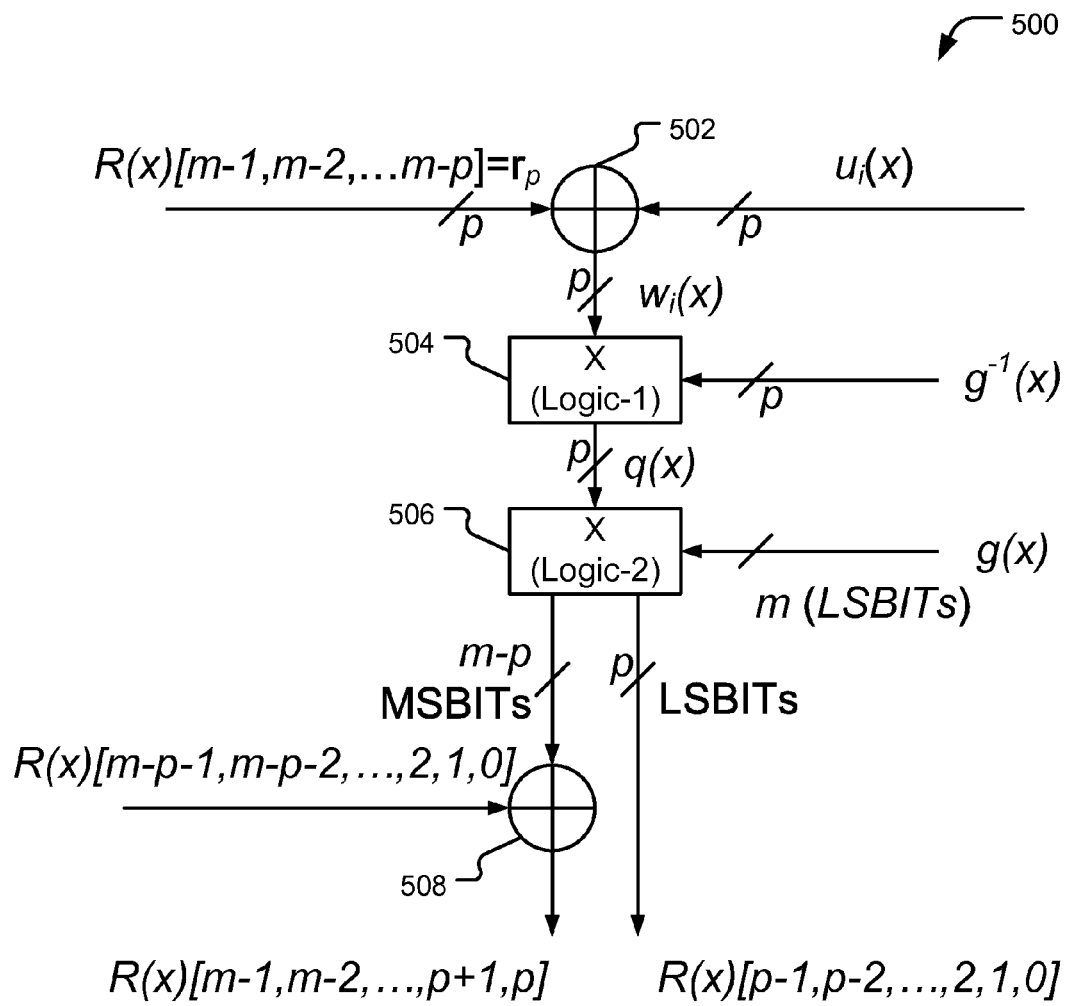
FIG. 5 is a block diagram of a first particular embodiment of a system configured to perform multi-stage polynomial division when a number of terms of a divisor is greater than a number of dividend terms evaluated during a division stage.

FIG. 5 depicts a first embodiment of a system 500 configured to perform multi-stage polynomial division corresponding to the case m>p. The system 500 includes a first adder 502, a quotient processing unit (Logic-1) 504, a first remainder processing unit (Logic-2) 506, and a second adder 508. In the system 500, Logic-1 504 executes the multiplication of Eq. (18) and Logic-2 506 performs the calculation of Eq. (19).

Combining Eq. (18) and Eq. (19), and substituting for $r_m$ from Eq. (16), the resulting expression is given by Eq. (23):

$$r_m = G_m G_p^{-1}(u_p + r_p) = G_m G_p^{-1} w_p, \quad (23)$$

FIG. 6 depicts a second embodiment of a system 600 configured to perform multi-stage polynomial division corresponding to the case m>p. The system 600 includes a first adder 602, a remainder processing unit (Logic-3) 606, and a second adder 608. In the system 600, Logic-3 606 performs the calculation of Eq. (23).

After performing k iterations, where k satisfies the equation n=m+kp−1, the final result for the remainder polynomial r(x) is the polynomial associated with the vector given by Eq. (24):

$$r(x) = r_m + u_m \quad (24)$$

In Eq. (24), $r_m$ is as previously defined in Eq. (23) and $u_m$ is the vector associated with the m LSB coefficients of the polynomial u(x). The quotient polynomial q(x) may be obtained by concatenating all the vectors $q_p$ from all the iterations. However, in many cases, there is interest only in r(x), the remainder of the calculation.

For the sake of illustration, an example is considered in which m=4, p=3, and g(x) is given by Eq. (25):

$$g(x) = 1 + x^3 + x^4 \quad (25)$$

A value of $g^{-1}(x)$ is given by Eq. (26):

$$g^{-1}(x) = 1 + x + x^2 \quad (26)$$

Matrices representing $G_p$, $G_o^{-1}$, and $G_m$ are given by Eq. (27):

$$G_p = \begin{pmatrix} 1 & 1 & 0 \\ 0 & 1 & 1 \\ 0 & 0 & 1 \end{pmatrix}, G_p^{-1} = \begin{pmatrix} 1 & 1 & 1 \\ 0 & 1 & 1 \\ 0 & 0 & 1 \end{pmatrix}, G_m = \begin{pmatrix} 1 & 0 & 0 \\ 0 & 1 & 0 \\ 0 & 0 & 1 \\ 1 & 0 & 0 \end{pmatrix} \quad (27)$$

Referring to FIG. 5, for an input vector of $(w_2, w_1, w_0)$, the output of Logic-1 504 will be as given by Eq. (28):

$$(q_2, q_1, q_0) = (w_2, w_1 + w_2, w_0 + w_1 + w_2) \quad (28)$$

The output of Logic-2 506 of FIG. 5 (or of Logic-3 606 of FIG. 6) is given by Eq. (29):

$$R = (r_3, r_2, r_1, r_0) = (w_2, w_1 + w_0, w_2, w_2 + w_1, w_2 + w_1 + w_0) \quad (29)$$

The LSB of R from the previous iteration will be added to the MSB of the current R to generate R for the next iteration.

In general, for m=4, p=3, a value of g(x) is given by Eq. (30) and matrices for $G_p$, $G_o^{-1}$, and $G_m$ are given by Eq. (31):

$$g(x) = g_0 + g_1 x + g_2 x^2 + g_3 x^3 + x^4 \quad (30)$$

$$G_p = \begin{pmatrix} 1 & g_3 & g_2 \\ 0 & 1 & g_3 \\ 0 & 0 & 1 \end{pmatrix}, G_p^{-1} = \begin{pmatrix} 1 & g_3 & g_2 + g_3 \\ 0 & 1 & g_3 \\ 0 & 0 & 1 \end{pmatrix} \quad (31)$$

$$G_m = \begin{pmatrix} g_0 & 0 & 0 \\ g_1 & g_0 & 0 \\ g_2 & g_1 & g_0 \\ g_3 & g_2 & g_1 \end{pmatrix}$$

The combined Logic-3 606 of FIG. 6 will implement the matrix of Eq. (32):

$$G_m G_p^{-1} = \begin{pmatrix} g_0 & g_0 g_3 & g_0 g_2 + g_0 g_3 \\ g_1 & g_1 g_3 + g_0 & g_1 g_2 + g_1 g_3 + g_0 g_3 \\ g_2 & g_2 g_3 + g_1 & g_2 + g_2 g_3 + g_1 g_3 + g_0 \\ g_3 & g_3 + g_2 & g_1 + g_3 \end{pmatrix} \quad \text{Eq. (32)}$$

Equations (30), (31), and (32) yield the results of Eqs. (33) and (34):

$$G_p^{-1} \begin{pmatrix} w_0 \\ w_1 \\ w_2 \end{pmatrix} = \begin{pmatrix} w_0 + g_3 w_1 + (g_2 + g_3) w_2 \\ w_1 + g_3 w_2 \\ w_2 \end{pmatrix} = \begin{pmatrix} q_0 \\ q_1 \\ q_2 \end{pmatrix} \quad \text{Eq. (33)}$$

$$\begin{pmatrix} r_0 \\ r_1 \\ r_2 \\ r_3 \end{pmatrix} = G_m G_p^{-1} \begin{pmatrix} w_0 \\ w_1 \\ w_2 \end{pmatrix} = G_m \begin{pmatrix} q_0 \\ q_1 \\ q_2 \end{pmatrix} = \quad \text{Eq. (34)}$$

$$\begin{pmatrix} g_0 w_0 + g_0 g_3 w_1 + g_0 (g_2 + g_3) w_2 \\ g_1 w_0 + (g_1 g_3 + g_0) w_1 + (g_0 g_3 + g_1 g_2 + g_1 g_3) w_2 \\ g_2 w_0 + (g_2 g_3 + g_1) w_1 + (g_0 + g_2 + g_1 g_3 + g_2 g_3) w_2 \\ g_3 w_0 + (g_2 + g_3) w_1 + (g_1 + g_3) w_2 \end{pmatrix}$$

The implementations of hardware systems 500 and 600 of FIGS. 5 and 6, respectively, are theoretically equivalent. However computational complexity of systems 500 and 600 may differ significantly.

For example, the arithmetic complexity of multiplication by a predefined matrix is proportional to the number of non-zero elements in the matrix. Therefore, the decision on which of the hardware systems 500 and 600 to choose may depend on the total number of non-zero elements in the matrices $G_m$ and $G_p^{-1}$ (e.g. the sparseness of the matrices), relative to the number of non-zero elements in the product matrix $G_m G_p^{-1}$. Basing a determination of one of systems 500 and 600 by comparing sparseness of matrices may be simplistic in some cases. For example, the complexity of multiplication by a predefined matrix does not present as significant a concern when parallel processing is available to perform the matrix multiplication. In this case, one may be willing to add hardware components, including multipliers, XOR gates, or adders, to enhance the speed of the computation. However, the speed of the computation may be a function of the parallel complexity of the equations to be solved, and sometimes a solution with more non-zero elements may have less parallel complexity than for a situation in which the matrices have fewer non-zero elements.

The foregoing description addressed a case in which m, the number of terms in a divisor, exceeds p, the number of terms of the codeword processed during an iteration (i.e., m>p). When m=p, however, some portions of the hardware systems may be passed or omitted. Specifically, the lower-left branches including the second adders 508 and 608 of FIGS. 5 and 6 may be eliminated, as illustrated in FIGS. 7 and 8.

Figure 7:
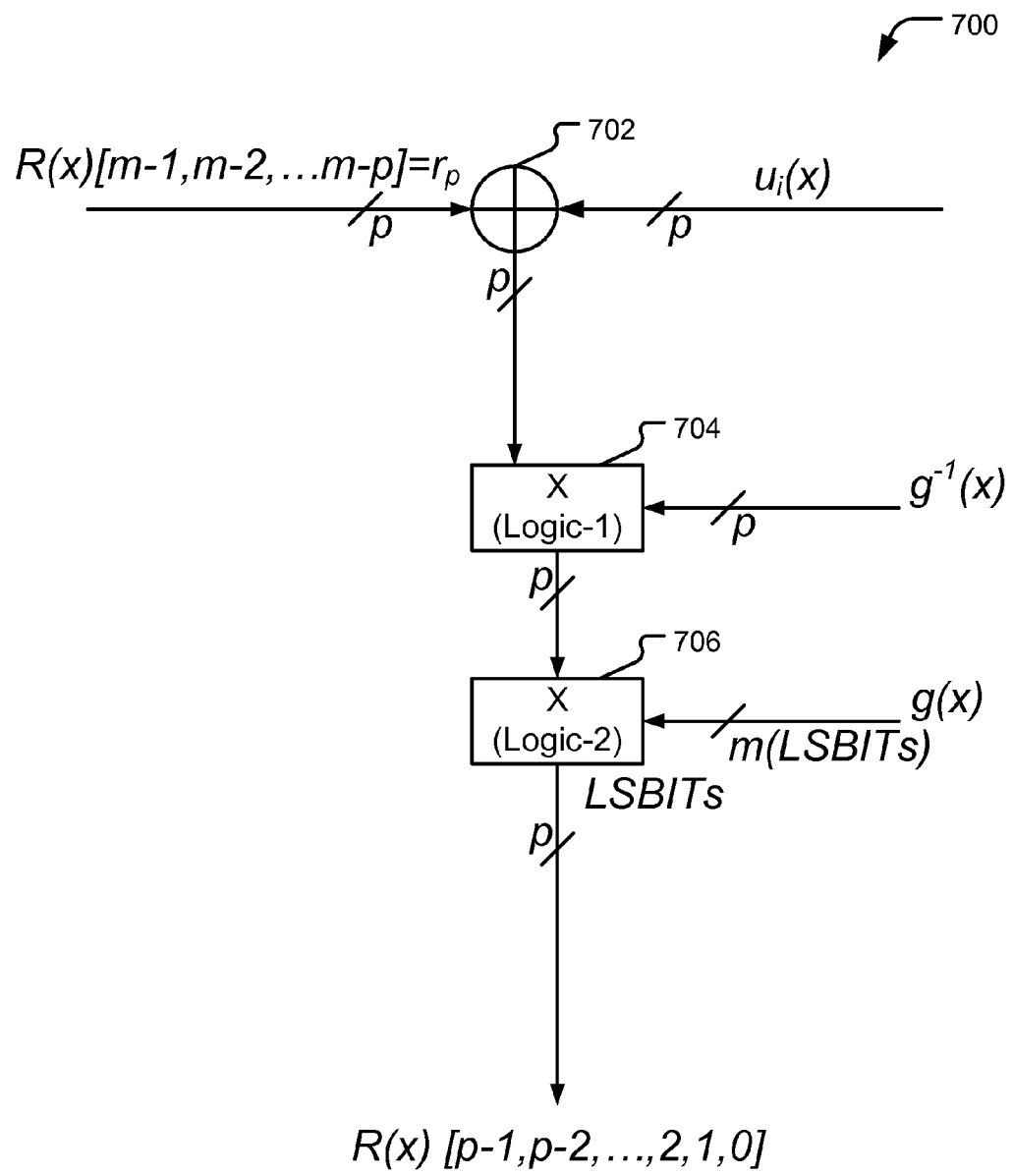
FIG. 7 is a block diagram of a first particular embodiment of a system configured to perform multi-stage polynomial division when a number of terms of a divisor is equal to a number of dividend terms evaluated during a division stage.

FIG. 7 depicts a first embodiment of a system 700 configured to perform multi-stage polynomial division corresponding to the case m=p. The system 700 includes a first adder 702, a quotient processing unit (Logic-1) 704, and a first remainder processing unit (Logic-2) 706. In the system 700, Logic-1 704 executes the multiplication of Eq. (18) and Logic-2 706 performs the calculation of Eq. (19).

Figure 8:
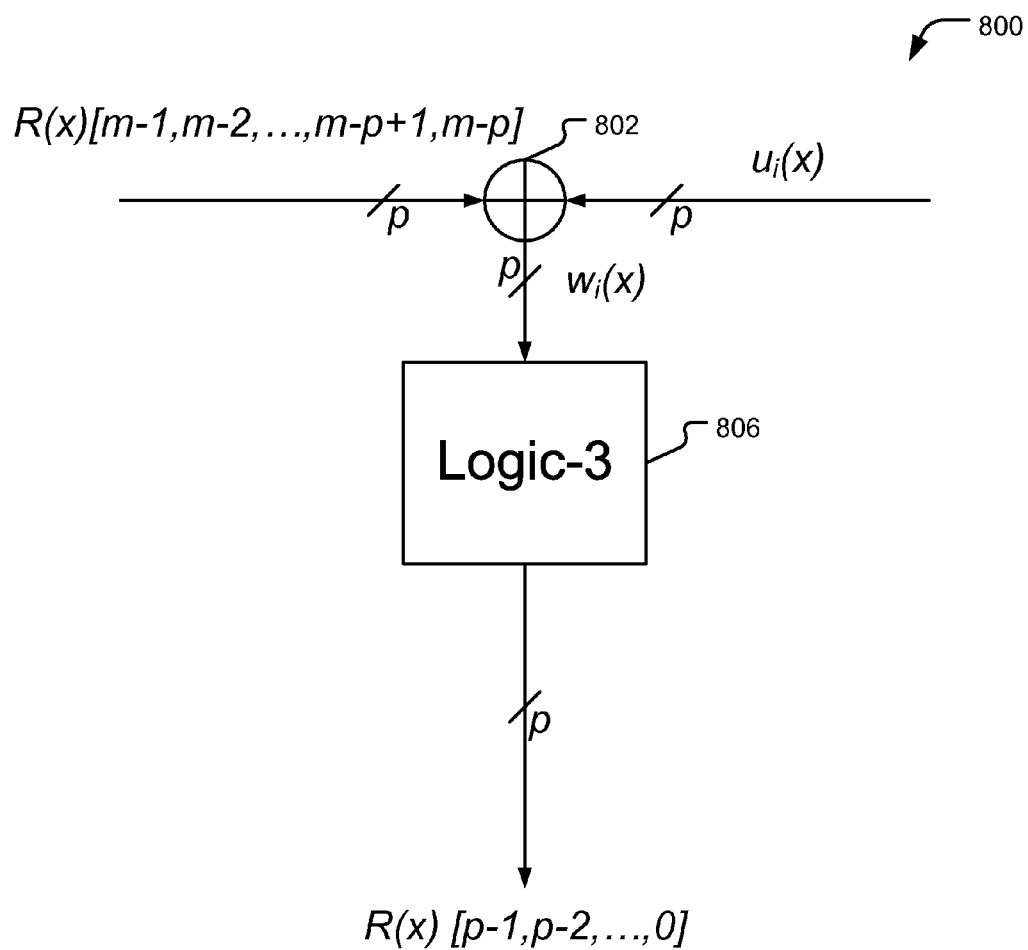
FIG. 8 is a block diagram of a second particular embodiment of a system configured to perform multi-stage polynomial division when a number of terms of a divisor is equal to a number of dividend terms evaluated during a division stage.

FIG. 8 depicts a second embodiment of a system 800 configured to perform multi-stage polynomial division corresponding to the case m=p. The system 800 includes a first adder 802 and a first remainder processing unit (Logic-3) 806. In the system 800, Logic-3 806 performs the calculation of Eq. (23).

There also may be cases in which m, the number of terms in a divisor, is less than p, the number of terms in the codeword (i.e., m<p). Where m<p, the matrix equation of Eq. (17) is simplified to Eq. (35):

$$\begin{bmatrix} r_0 \\ r_1 \\ \vdots \\ \vdots \\ r_{m-1} \end{bmatrix} = \begin{bmatrix} g_0 & 0 & \vdots & \vdots & \vdots & \vdots & 0 \\ g_1 & g_0 & 0 & \vdots & \vdots & \vdots & \vdots \\ \vdots & g_1 & g_0 & \vdots & \vdots & \vdots & \vdots \\ \vdots & \vdots & \vdots & \vdots & 0 & \vdots & \vdots \\ g_{m-1} & \vdots & \vdots & \vdots & g_0 & \vdots & 0 \end{bmatrix} \cdot \begin{bmatrix} q_0 \\ q_1 \\ \vdots \\ q_{m-1} \\ \vdots \\ q_{p-1} \end{bmatrix} \quad \text{Eq. (35)}$$

Thus, only the first LSB m coefficients of $q_p$ contribute to $r_m$, and therefore equation (35) may be replaced by Eq. (36):

$$\begin{bmatrix} r_0 \\ r_1 \\ \vdots \\ \vdots \\ r_{m-1} \end{bmatrix} = \begin{bmatrix} g_0 & 0 & \vdots & \vdots & 0 \\ g_1 & g_0 & \vdots & \vdots & \vdots \\ \vdots & g_1 & g_0 & \vdots & \vdots \\ \vdots & \vdots & \vdots & \vdots & 0 \\ g_{m-1} & \vdots & \vdots & \vdots & g_0 \end{bmatrix} \begin{bmatrix} q_0 \\ q_1 \\ \vdots \\ \vdots \\ q_{m-1} \end{bmatrix} \quad (36)$$

In Eq. (36), the matrix $G_m$ is a matrix of the order m×m. If the quotient q(x) is not required, and the only interest is in the final remainder r(x), the last p−m rows of $G_p^{-1}$, may be omitted and only the m LSB element of $q_p$ are computed at each iteration.

The computation of $g^{-1}(x)$ may be performed by slightly modifying Eq. (22) such that all elements $g_a$ for which a<0 are set to zero. The resulting modified version of Eq. (22) is given by Eq. (37)

$$\begin{bmatrix} g_m & g_{m-1} & g_{m-2} & \vdots & \vdots & g_1 & g_0 & 0 & \vdots & 0 \\ 0 & g_m & g_{m-1} & \vdots & \vdots & \vdots & g_1 & g_0 & 0 & 0 \\ 0 & 0 & g_m & \vdots & \vdots & \vdots & \vdots & g_1 & g_0 & 0 \\ \vdots & 0 & 0 & g_m & \vdots & \vdots & \vdots & \vdots & \vdots & \vdots \\ \vdots & \vdots & 0 & \vdots & \vdots & \vdots & \vdots & \vdots & \vdots & \vdots \\ \vdots & \vdots & \vdots & \vdots & \vdots & \vdots & \vdots & \vdots & \vdots & \vdots \\ \vdots & \vdots & \vdots & \vdots & \vdots & \vdots & \vdots & g_{m-2} & \vdots & \vdots \\ \vdots & \vdots & \vdots & \vdots & \vdots & \vdots & \vdots & g_{m-1} & g_{m-2} & \vdots \\ 0 & 0 & \vdots & \vdots & \vdots & \vdots & \vdots & g_m & g_{m-1} & \vdots \\ 0 & 0 & 0 & \vdots & \vdots & \vdots & \vdots & 0 & g_m \end{bmatrix} \cdot \begin{bmatrix} g_0^{-1} \\ g_1^{-1} \\ g_2^{-1} \\ \vdots \\ \vdots \\ \vdots \\ \vdots \\ \vdots \\ g_{p-3}^{-1} \\ g_{p-2}^{-1} \\ g_{p-1}^{-1} \end{bmatrix} = \begin{bmatrix} 0 \\ 0 \\ 0 \\ \vdots \\ \vdots \\ \vdots \\ \vdots \\ \vdots \\ 0 \\ 0 \\ 1 \end{bmatrix} \quad \text{Eq. (37)}$$

The result of Eq. (37) implies changes to systems 500 and 600 of FIGS. 5 and 6. Specifically, an input of remainder terms to the adders 502 and 602 may include only the m bits of $r_m$. Therefore there is only reason to apply an XOR to these bits with the m MSB-s of u, while the remaining p−m bits flow directly into Logic-1 504 and Logic-3 606 respectively. In addition, in the lower part of the figures, the left "leg" including the second adders 508 and 608 are omitted, while the right "leg" produces the m next bits of R(x), as illustrated in FIGS. 9 and 10.

Figure 9:
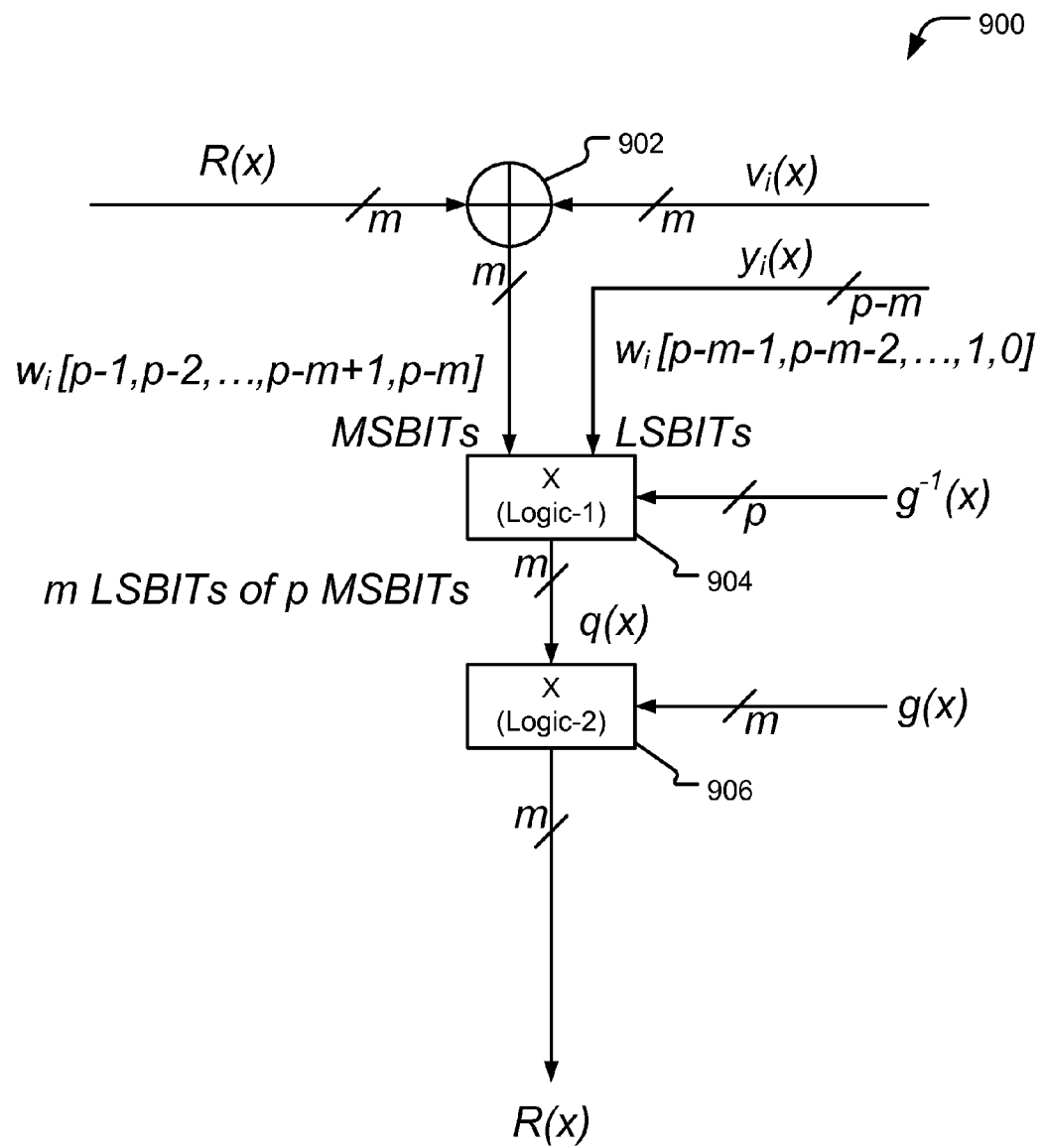
FIG. 9 is a block diagram of a first particular embodiment of a system configured to perform multi-stage polynomial division when a number of terms of a divisor is less than a number of dividend terms evaluated during a division stage.

FIG. 9 depicts a first embodiment of a system 900 configured to perform multi-stage polynomial division corresponding to the case m<p. The system 900 includes a first adder 902, a quotient processing unit (Logic-1) 904, and a first remainder processing unit (Logic-2) 906.

Figure 10:
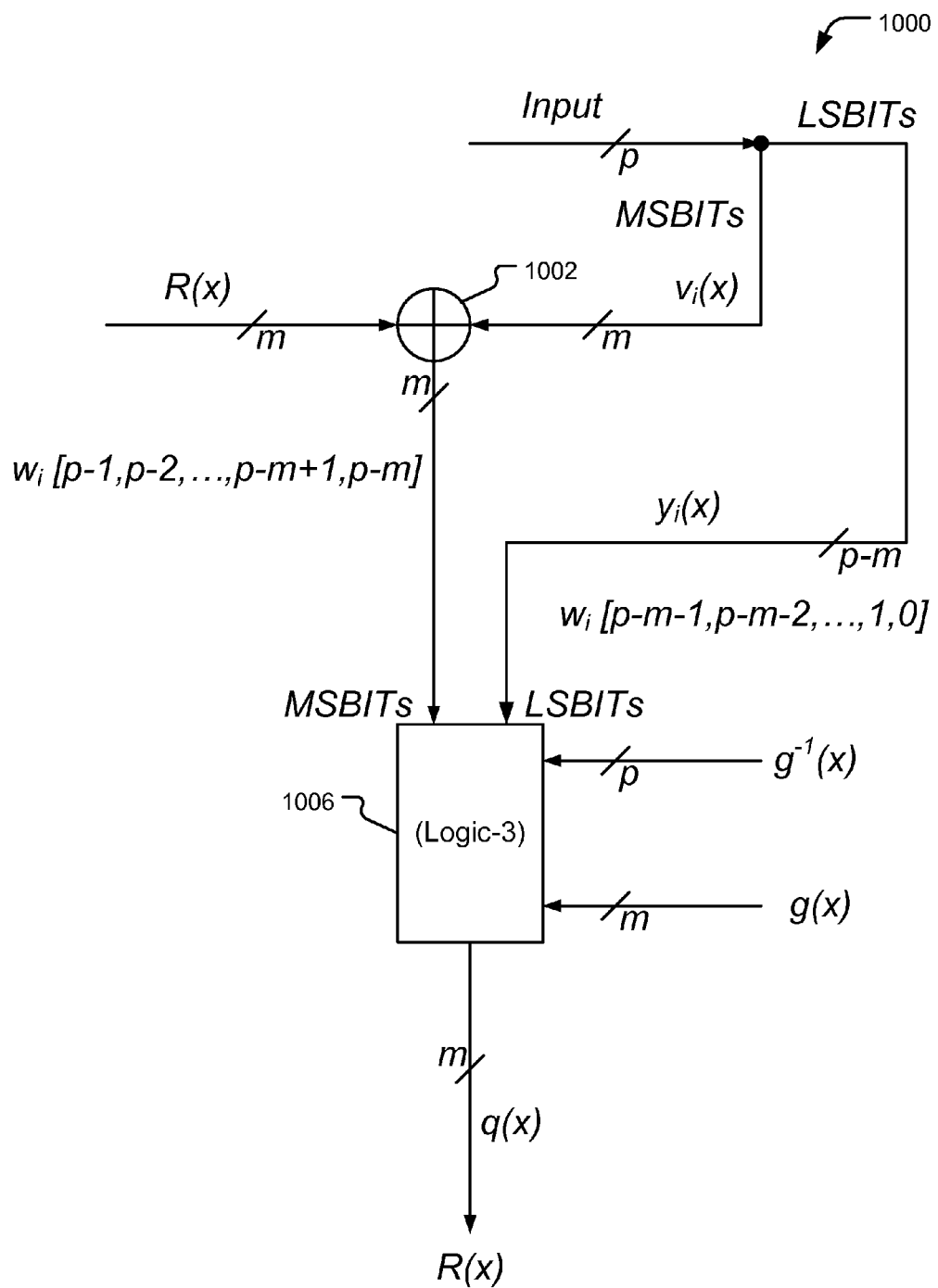
FIG. 10 is a block diagram of a second particular embodiment of a system configured to perform multi-stage polynomial division when a number of terms of a divisor is less than a number of dividend terms evaluated during a division stage.

FIG. 10 depicts a second embodiment of a system 1000 configured to perform multi-stage polynomial division corresponding to the case m<p. The system 1000 includes a first adder 1002 and a first remainder processing unit (Logic-3) 1006.

In FIGS. 9 and 10, $v_i(x)$ denotes the m MSBits of $u_p$ and the following p−m bits are denoted by $y_i(x)$. For an illustrative example, consider a case in which m=3, p=4, a value of g(x) is given by Eq. (38), and a pseudoinverse of g(x), $g^{-1}(x)$ is given by Eq. (39):

$$g(x) = 1 + x^2 + x^3 \quad (38)$$

$$g^{-1}(x) = x + x^2 + x^3 \quad (39)$$

Values of the matrices $G_p$, $G_p^{-1}$, and $G_m$ are given by Eq. (40):

$$G_p = \begin{pmatrix} 1 & 1 & 0 & 1 \\ 0 & 1 & 1 & 0 \\ 0 & 0 & 1 & 1 \\ 0 & 0 & 0 & 1 \end{pmatrix}, G_p^{-1} = \begin{pmatrix} 1 & 1 & 1 & 0 \\ 0 & 1 & 1 & 1 \\ 0 & 0 & 1 & 1 \\ 0 & 0 & 0 & 1 \end{pmatrix}, G_m = \begin{pmatrix} 1 & 0 & 0 \\ 0 & 1 & 0 \\ 1 & 0 & 1 \end{pmatrix} \quad (40)$$

Omitting the last row of $G_p^{-1}$, (while reusing the symbol $G_p^{-1}$ for the reduced matrix) gives the simplified matrix of Eq. (41):

$$G_p^{-1} = \begin{pmatrix} 1 & 1 & 1 & 0 \\ 0 & 1 & 1 & 1 \\ 0 & 0 & 1 & 1 \end{pmatrix} \quad (41)$$

For an input vector of $(w_3, w_2, w_1, w_0)$, the output of Logic-1 904 of FIG. 9 is given by Eq. (42), and the output of Logic-2 906 of FIG. 9 or of Logic-3 1006 of FIG. 10 in the combined case is given by Eq. (43):

$$(q_2, q_1, q_0) = (w_2 + w_3, w_1 + w_2 + w_3, w_0 + w_1 + w_2) \quad (42)$$

$$R = (r_2, r_1, r_0) = (w_3 + w_1 + w_0, w_3 + w_2 + w_1, w_2 + w_1 + w_0) \quad (43)$$

In general, for m=3, p=4, and a value of g(x) as given by Eq. (44), the values of the matrices $G_p$, $G_p^{-1}$, and $G_m$ are given by Eq. (45):

$$g(x) = g_0 + g_1 x + g_2 x^2 + x^3 \quad (44)$$

$$G_p = \begin{pmatrix} 1 & g_2 & g_1 & g_0 \\ 0 & 1 & g_2 & g_1 \\ 0 & 0 & 1 & g_2 \\ 0 & 0 & 0 & 1 \end{pmatrix}, G_p^{-1} = \begin{pmatrix} 1 & g_2 & g_1 + g_2 & g_0 + g_2 \\ 0 & 1 & g_2 & g_1 + g_2 \\ 0 & 0 & 1 & g_2 \end{pmatrix} \quad \text{Eq. (45)}$$

$$G_m = \begin{pmatrix} g_0 & 0 & 0 \\ g_1 & g_0 & 0 \\ g_2 & g_1 & g_0 \end{pmatrix}$$

The value of the matrix for $G_m G_p^{-1}$ for the combined Logic-3 1006 of FIG. 10 is given by Eq. (46):

$$G_m G_p^{-1} = \begin{pmatrix} g_0 & g_0 g_2 & g_0 g_1 + g_0 g_2 & g_0 + g_0 g_2 \\ g_1 & g_1 g_2 + g_0 & g_1 + g_1 g_2 + g_0 g_2 & g_0 g_2 + g_1 g_2 \\ g_2 & g_1 + g_2 & g_0 + g_2 & g_1 + g_1 g_2 + g_2 \end{pmatrix} \quad \text{Eq. (46)}$$

Solving the equations for q and r yields Eqs. (47) and (48):

$$G_p^{-1} \begin{pmatrix} w_0 \\ w_1 \\ w_2 \\ w_3 \end{pmatrix} = \begin{pmatrix} w_0 + g_2 w_1 + (g_1 + g_2) w_2 + (g_0 + g_2) w_3 \\ w_1 + g_2 w_2 + (g_1 + g_2) w_3 \\ w_2 + g_2 w_3 \end{pmatrix} = \begin{pmatrix} q_0 \\ q_1 \\ q_2 \end{pmatrix} \quad \text{Eq. (47)}$$

$$\begin{pmatrix} r_0 \\ r_1 \\ r_2 \end{pmatrix} = G_m \begin{pmatrix} q_0 \\ q_1 \\ q_2 \end{pmatrix} = \quad \text{Eq. (48)}$$

$$\begin{pmatrix} g_0 w_0 + g_0 g_2 w_1 + (g_0 g_1 + g_0 g_2) w_2 + (g_0 + g_0 g_2) w_3 \\ g_1 w_0 + (g_1 g_2 + g_0) w_1 + (g_1 + g_0 g_2 + g_1 g_2) w_2 + \\ (g_0 g_2 + g_1 g_2) w_3 \\ g_2 w_0 + (g_1 + g_2) w_1 + (g_0 + g_2) w_2 + (g_1 + g_2 + g_1 g_2) w_3 \end{pmatrix}$$

The computation of $g^{-1}(x)$ may be performed by slightly modifying Eq. (22) such that all elements $g_a$ with a<0 are set to 0.

In a case where m>p, potential problems facing an implementation with high clock speed and a large number of terms in the divisor, m, may be propagation delay and routing. To address these potential concerns, a single pipe implementation may be used in which a restriction that a logic tree is to be computed in a single clock is relaxed. Incorporating D flip-flops between Logic-1 and Logic-2, for example Logic-1 504 and Logic-2 506 of FIG. 5, may avoid the use of large buffers and relax routing requirements. The D flip-flops may be incorporated by introducing duplication of the '2×p' D flip-flops (DFFs), in such a manner that each will serve a portion of the m outputs in the 'R(x)' register.

A simple way to describe the pipeline architecture from a data flow perspective is to partition the dividend polynomial u(x) into two polynomials, $u_{even}$ and $u_{odd}$, as given by Eq (49):

$$u_{even} = \begin{bmatrix} 0 \\ u_{p,*} \\ \vdots \\ 0 \\ u_{p,2} \\ 0 \\ u_{p,0} \end{bmatrix}, u_{odd} = \begin{bmatrix} u_{p,*-1} \\ 0 \\ \vdots \\ u_{p,3} \\ 0 \\ u_{p,1} \\ 0 \end{bmatrix} \quad (49)$$

Each of the components $u_{p,*}$ is a vector of p coordinates. The 0 components are also vectors of p coordinates. For the sake of simplicity, the first m coefficients are omitted.

The division algorithm performs alternately on 2p bits from the even polynomial $u_{even}$ and from the odd polynomial $u_{odd}$, and the interaction between the two is achieved through the remainder r, which may have odd and even components. However, because computation of the remainder at an even iteration only comes into effect in the next even iteration, the remainder need not be computed concurrently with the q components of the even iteration, and computation of the remainder may be postponed and computed during the following odd iteration. Correspondingly, for odd iterations, the remainder at odd iterations only comes into effect in the next odd iteration. Thus, the remainder need not be computed concurrently with the q components of the odd iteration, and computation of the remainder may be postponed and computed during the following even iteration.

In principle, the first iteration computes the vector $q_{2p,0}$ as given by Eq. (50), where $u_{2p,0}$ is the vector of length 2p, as given by Eq. (51) and $G_{2p}^{-1}$ is defined by the same manner as in Eq. (12) replacing 'p' with 2×p.

$$q_{2p,0} = G_{2p}^{-1} u_{2p,0}, \quad (50)$$

$$u_{2p,0} = \begin{bmatrix} 0 \\ u_{p,0} \end{bmatrix}, \quad (51)$$

The polynomial $g_{2p}^{-1}(x)$ may be computed by solving Eq. (52):

$$\begin{bmatrix} g_m & g_{m-1} & g_{m-2} & \vdots & \vdots & g_{m-2p+2} & g_{m-2p+1} \\ 0 & g_m & g_{m-1} & \vdots & \vdots & g_{m-2p+3} & g_{m-2p+2} \\ 0 & 0 & g_m & \vdots & \vdots & \vdots & g_{m-2p+3} \\ \vdots & 0 & 0 & g_m & \vdots & \vdots & \vdots \\ \vdots & \vdots & 0 & \vdots & \vdots & \vdots & \vdots \\ \vdots & \vdots & \vdots & \vdots & \vdots & \vdots & \vdots \\ \vdots & \vdots & \vdots & \vdots & \vdots & g_{m-2} & \vdots \\ \vdots & \vdots & \vdots & \vdots & \vdots & g_{m-1} & g_{m-2} \\ 0 & 0 & \vdots & \vdots & \vdots & g_m & g_{m-1} \\ 0 & 0 & 0 & \vdots & \vdots & 0 & g_m \end{bmatrix} \cdot \begin{bmatrix} g_0^{-1} \\ g_1^{-1} \\ g_2^{-1} \\ \vdots \\ \vdots \\ \vdots \\ \vdots \\ g_{2p-3}^{-1} \\ g_{2p-2}^{-1} \\ g_{2p-1}^{-1} \end{bmatrix} = \begin{bmatrix} 0 \\ 0 \\ 0 \\ \vdots \\ \vdots \\ \vdots \\ \vdots \\ 0 \\ 0 \\ 1 \end{bmatrix} \quad \text{Eq. (52)}$$

Because the first p coordinates of $u_{2p,0}$ are 0, the first p columns of $G_{2p}^{-1}$ may be omitted. By reuse of notation, the reduced matrix of order 2p×p is designated as: $G_{2p,p}^{-1}$. The first iteration may compute as given by Eq. (53):

$$q_{2p,0} = G_{2p,p}^{-1} u_{p,0},  \qquad (53)$$

Eq. (53) is expressed as the matrix equation of Eq. (54):

$$\begin{bmatrix} q_0 \\ q_1 \\ q_2 \\ \vdots \\ \vdots \\ q_{p-2} \\ q_{p-1} \\ q_p \\ q_{p+1} \\ q_{p+2} \\ \vdots \\ \vdots \\ q_{2p-3} \\ q_{2p-2} \\ q_{2p-1} \end{bmatrix} = \begin{bmatrix} g_{p-1}^{-1} & g_{p-2}^{-1} & \vdots & \vdots & \vdots & g_2^{-1} & g_1^{-1} & g_0^{-1} \\ g_p^{-1} & g_{p-1}^{-1} & \vdots & \vdots & \vdots & g_3^{-1} & g_2^{-1} & g_1^{-1} \\ g_{p+1}^{-1} & g_p^{-1} & g_{p-1}^{-1} & \vdots & \vdots & \vdots & g_3^{-1} & g_2^{-1} \\ \vdots & \vdots & \vdots & \vdots & \vdots & \vdots & \vdots & g_3^{-1} \\ \vdots & \vdots & \vdots & \vdots & \vdots & \vdots & \vdots & \vdots \\ g_{2p-3}^{-1} & \vdots & \vdots & \vdots & g_{p+1}^{-1} & g_p^{-1} & g_{p-1}^{-1} & g_{p-2}^{-1} \\ g_{2p-2}^{-1} & g_{2p-3}^{-1} & \vdots & \vdots & g_{p+2}^{-1} & g_{p+1}^{-1} & g_p^{-1} & g_{p-1}^{-1} \\ 1 & g_{2p-2}^{-1} & g_{2p-3}^{-1} & \vdots & \vdots & g_{p+2}^{-1} & g_{p+1}^{-1} & g_p^{-1} \\ 0 & 1 & g_{2p-2}^{-1} & \vdots & \vdots & \vdots & g_{p+2}^{-1} & g_{p+1}^{-1} \\ 0 & 0 & 1 & \vdots & \vdots & \vdots & \vdots & g_{p+2}^{-1} \\ \vdots & \vdots & \vdots & \vdots & \vdots & \vdots & \vdots & \vdots \\ \vdots & \vdots & \vdots & \vdots & 0 & 1 & g_{2p-2}^{-1} & g_{2p-3}^{-1} \\ 0 & \vdots & \vdots & \vdots & \vdots & 0 & 1 & g_{2p-2}^{-1} \\ 0 & 0 & \vdots & \vdots & \vdots & \vdots & 0 & 1 \end{bmatrix} \cdot \begin{bmatrix} u_0 \\ u_1 \\ u_2 \\ \vdots \\ \vdots \\ \vdots \\ \vdots \\ \vdots \\ \vdots \\ u_{p-3} \\ u_{p-2} \\ u_{p-1} \end{bmatrix} \qquad \text{Eq. (54)}$$

No remainder term is computed in the first iteration, and $q_{2p,0}$ is carried on to the next iteration.

For all subsequent iterations i until the last iteration, $q_{2p,i}$ may be computed according to Eq. (55):

$$q_{2p,i} = G_{2p,p}^{-1} w_{p,i} = G_{2p,p}^{-1} (u_{p,i} + r_{p,i-1}) \qquad (55)$$

The vector $r_{p,i-1}$ contains the p MSBits of the remainder vector as computed during the previous iteration. The remainder of the next iteration may be computed in parallel by first computing the equation given by Eq. (56):

$$r_{m,i} = G_m q_{2p,i-1}, \qquad (56)$$

In Eq. (56), $G_m$ is the matrix of order m×2p comprising the first m of the last m+2p rows, and the last 2×p columns of G. The definition of $G_m$ in Eq. (16) is adjusted to q vectors of length 2p. The equation given by Eq. (56) depicts the operation performed by Logic-2, such as the Logic-2 506 of FIG. 5.

However, it is noted that, when m<2p, then any $g_a$ for which a<0 in Eq. (56), is replaced by 0. Therefore, only the first m columns of the matrix may contain non-zero elements. In computing $r_m$ only m LSB elements of $q_{2p}$ participate in the computation. Therefore Logic-2 may take as input only m coefficients. In many cases there is no interest in the quotient q(x), only the remainder, r(x). In these cases Logic-1 may also be replaced by an m×p matrix $G_{m,p}^{-1}$ comprising the m first rows of $G_{2p,p}^{-1}$ as given in Eq. (57).

$$\begin{bmatrix} r_0 \\ r_1 \\ r_2 \\ \vdots \\ \vdots \\ \vdots \\ \vdots \\ \vdots \\ r_{m-2} \\ r_{m-1} \end{bmatrix} = \begin{bmatrix} g_0 & 0 & 0 & \vdots & \vdots & \vdots & \vdots \\ g_1 & g_0 & 0 & 0 & \vdots & \vdots & \vdots \\ g_2 & g_1 & g_0 & 0 & 0 & \vdots & \vdots \\ \vdots & \vdots & \vdots & \vdots & \vdots & \vdots & \vdots \\ g_{p-2} & \vdots & \vdots & \vdots & g_1 & g_0 & \vdots \\ g_{p-1} & g_{p-2} & \vdots & \vdots & g_2 & g_1 & g_0 \\ g_p & g_{p-1} & g_{p-2} & \vdots & \vdots & g_2 & g_1 \\ \vdots & \vdots & \vdots & \vdots & \vdots & \vdots & \vdots \\ g_{m-2} & g_{m-3} & \vdots & \vdots & g_{m-2p+1} & g_{m-2p} & g_{m-2p-1} \\ g_{m-1} & g_{m-2} & g_{m-3} & \vdots & \vdots & g_{m-2p+1} & g_{m-2p} \end{bmatrix} \cdot \begin{bmatrix} q_0 \\ q_1 \\ q_2 \\ \vdots \\ \vdots \\ \vdots \\ \vdots \\ \vdots \\ q_{2p-2} \\ q_{2p-1} \end{bmatrix} \qquad \text{Eq. (57)}$$

Values for the vector $r_{m,i}$ are added to the register containing the remainder $r_{m,i-1}$ with the proper bit adjustment, and the p MSB-s generates $r_{p,i}$ for the next iteration, as described with reference to FIG. 11.

Figure 11:
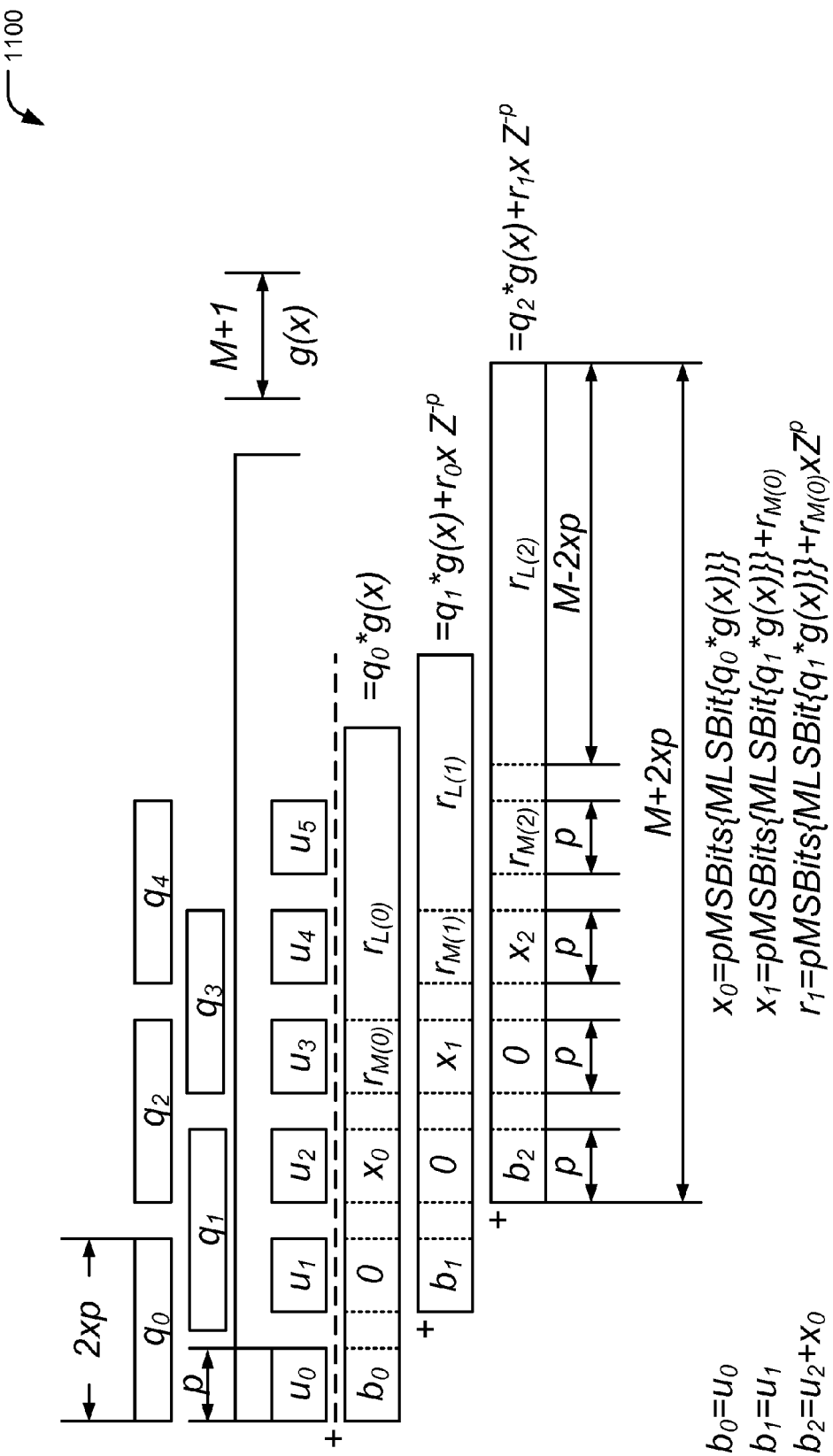
FIG. 11 is a general diagram of an embodiment of a pipelined multi-stage polynomial division operation when a number of terms of a divisor is greater than a number of dividend terms evaluated during a pipeline division stage.
Figure 12:
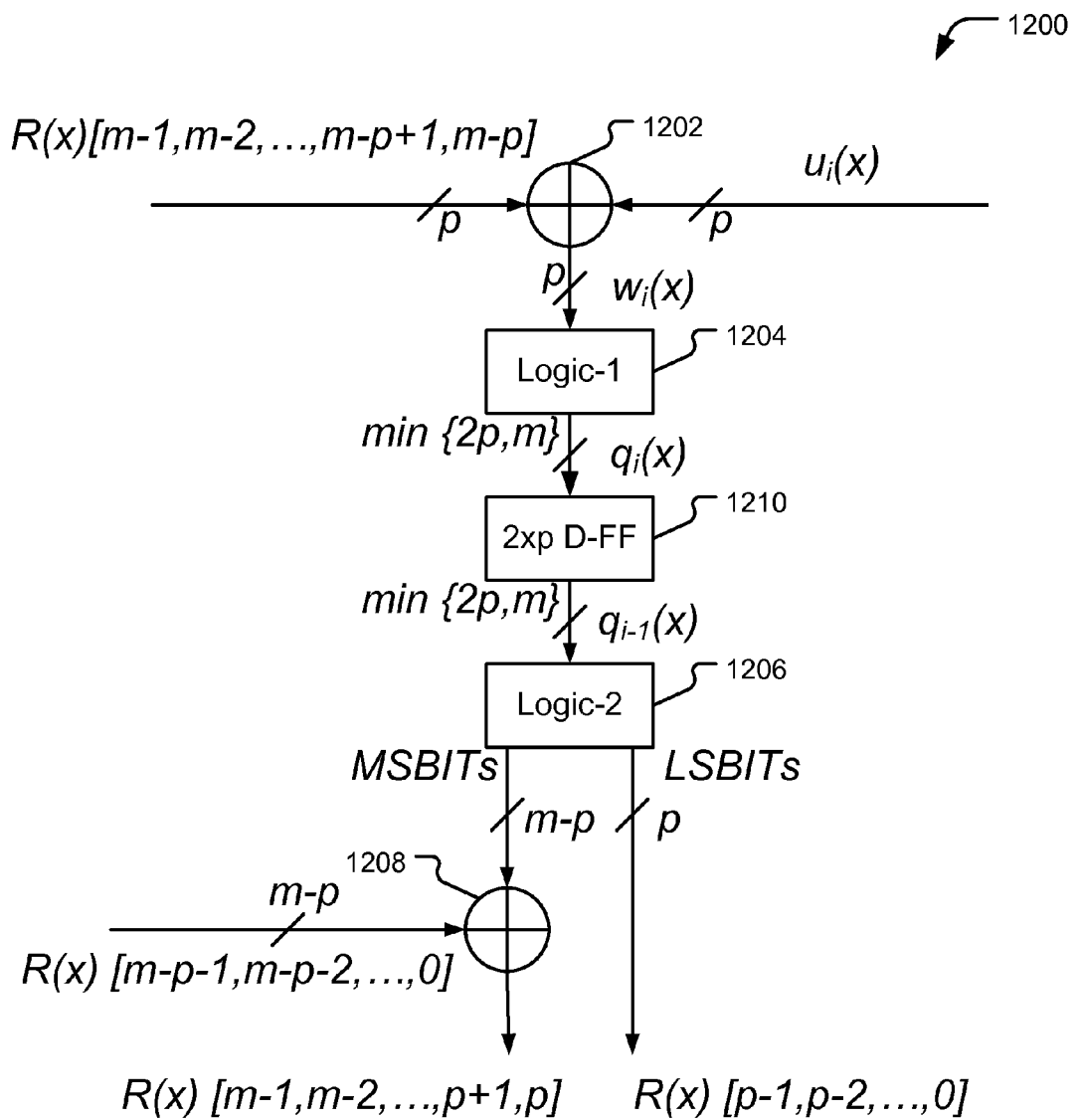
FIG. 12 is a block diagram of an embodiment of a system configured to perform a pipelined multi-stage polynomial division operation when a number of terms of a divisor is greater than a number of dividend terms evaluated during a pipeline division stage.

FIG. 11 illustrates a pipelined multi-stage polynomial division operation 1100 when a number of terms of a divisor is greater than a number of dividend terms evaluated during a pipeline division stage (i.e. m>p). A hardware implementation of the pipeline architecture is depicted in FIG. 12. FIG. 12 depicts a system 1200 that includes a first adder 1202, a quotient processing unit (Logic-1) 1204, a pipeline buffer 1210 (e.g. having 2×p D-FFs), a first remainder processing unit (Logic-2) 1206, and a second adder 1208.

The case of m<p is simpler than the case of m>p because, unlike the case of m>p, there is no interaction between $u_{even}$ and $u_{odd}$. Because there is no interaction between $u_{even}$ and $u_{odd}$, the two division computations of the two division operations may be performed in parallel.

There are some additional considerations. For example, because $G_m$ is a square matrix of order m, only m elements of $q_{2p,i-1}$ are taken into account while computing $r_{m,i}$ via $r_{m,i} = G_m q_{2p,i-1}$. Therefore, in cases where there is interest only in the remainder, r(x), not quotient, q(x), only the m LSB-s of $q_{2p,i}$ may be computed, and thus $G_{2p,p}^{-1}$ are reduced to $G_{m,p}^{-1}$, which is given in Eq. (58):

$$\begin{bmatrix} q_0 \\ q_1 \\ q_2 \\ \vdots \\ \vdots \\ \vdots \\ \vdots \\ q_{m-1} \end{bmatrix} = \qquad\qquad\qquad\qquad \text{Eq. (58)}$$

$$\begin{bmatrix} g_{p-1}^{-1} & g_{p-2}^{-1} & \vdots & \vdots & \vdots & g_2^{-1} & g_1^{-1} & g_0^{-1} \\ g_p^{-1} & g_{p-1}^{-1} & \vdots & \vdots & \vdots & g_3^{-1} & g_2^{-1} & g_1^{-1} \\ g_{p+1}^{-1} & g_p^{-1} & g_{p-1}^{-1} & \vdots & \vdots & \vdots & g_3^{-1} & g_2^{-1} \\ \vdots & \vdots & \vdots & \vdots & \vdots & \vdots & \vdots & g_3^{-1} \\ \vdots & \vdots & \vdots & \vdots & \vdots & \vdots & \vdots & \vdots \\ \vdots & \vdots & \vdots & \vdots & \vdots & \vdots & \vdots & \vdots \\ \vdots & \vdots & \vdots & \vdots & \vdots & \vdots & \vdots & \vdots \\ g_{m+p-2}^{-1} & \vdots & \vdots & \vdots & g_{m+2}^{-1} & g_{m+1}^{-1} & g_m^{-1} & g_{m-1}^{-1} \end{bmatrix} \cdot \begin{bmatrix} w_0 \\ w_1 \\ w_2 \\ \vdots \\ \vdots \\ \vdots \\ w_{p-3} \\ w_{p-2} \\ w_{p-1} \end{bmatrix}$$

Figure 13:
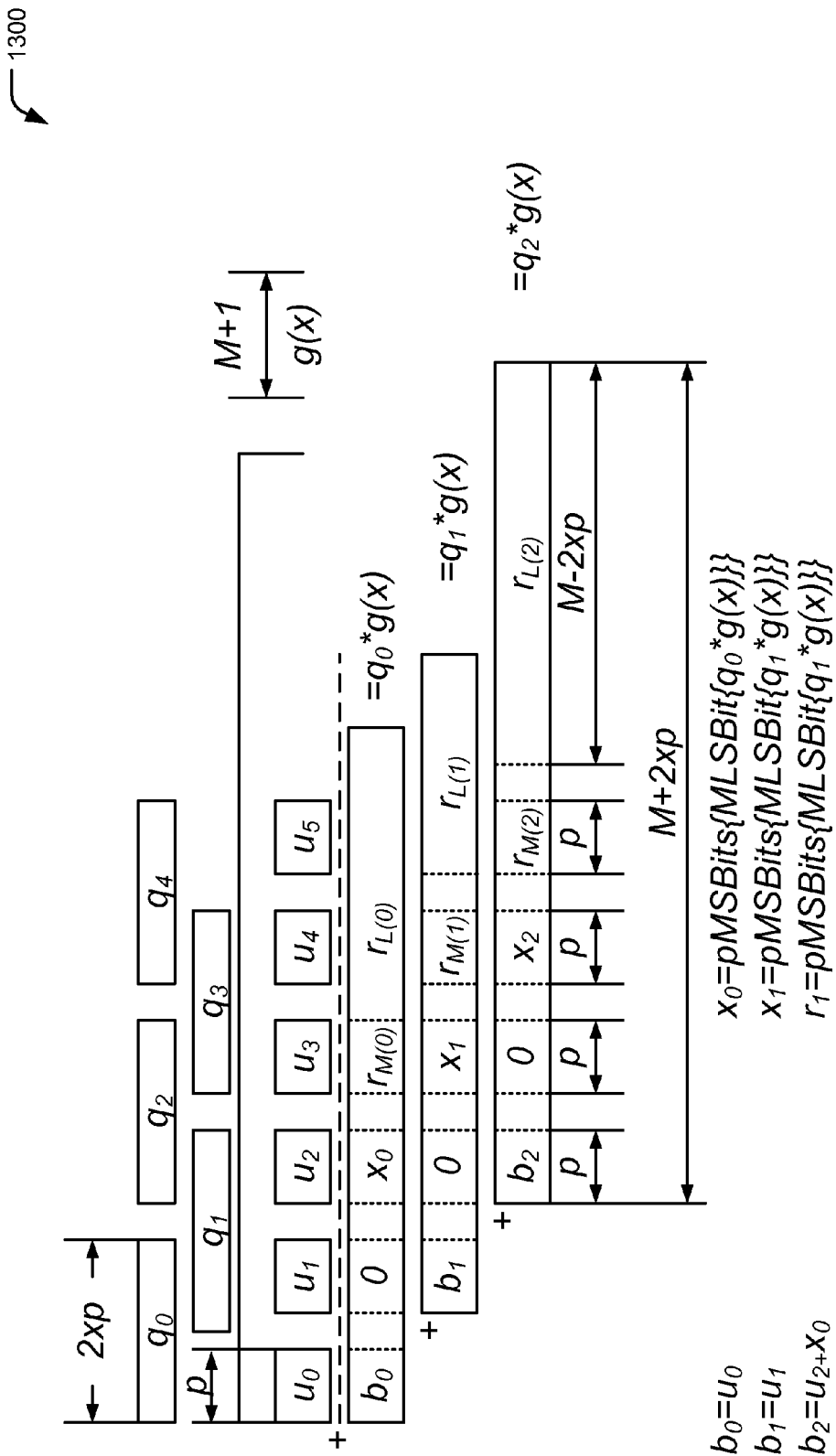
FIG. 13 is a general diagram of an embodiment of a pipelined multi-stage polynomial division operation when a number of terms of a divisor is less than a number of dividend terms evaluated during a pipeline division stage.
Figure 14:
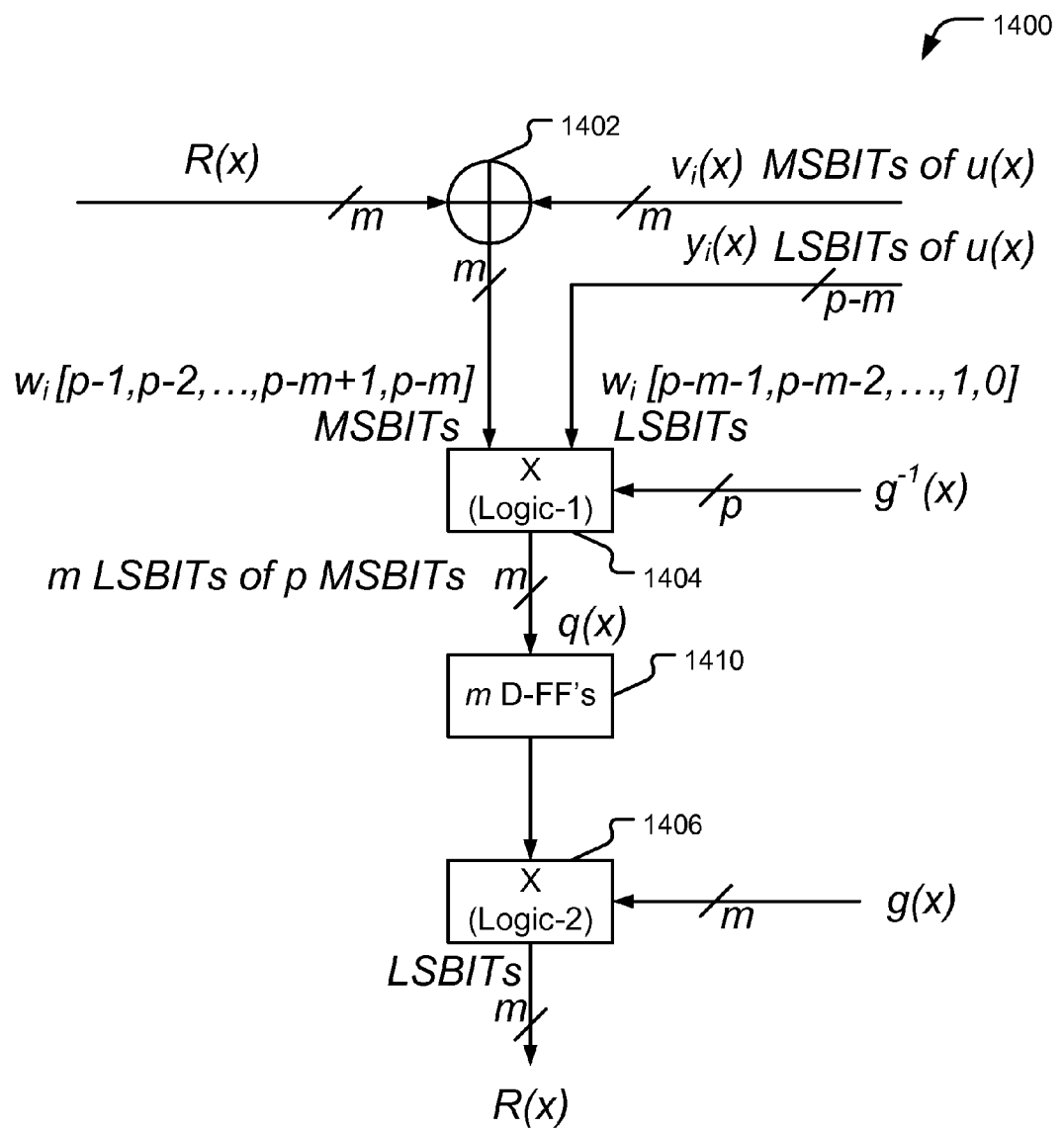
FIG. 14 is a block diagram of an embodiment of a system configured to perform a pipelined multi-stage polynomial division operation when a number of terms of a divisor is less than a number of dividend terms evaluated during a pipeline division stage.

FIG. 13 illustrates a pipelined multi-stage polynomial division operation 1300 when a number of terms of a divisor is less than a number of dividend terms evaluated during a pipeline division stage (i.e., m<p). A hardware implementation of the pipeline architecture may be achieved either by inserting a block of m D-FF-s between the block of $g^{-1}(x)$ (i.e. Logic-1 904) and the block of g(x) (i.e. Logic-2 906) in FIG. 9 or by duplicating FIG. 9 to two hardware machines, one for the even and one for the odd polynomials, where each machine is working in reduced speed, such as at half rate. An example of a hardware implementation of the pipeline architecture is depicted in FIG. 14. FIG. 14 depicts a system 1400 that includes a first adder 1402, a quotient processing unit (Logic-1) 1404, a pipeline buffer 1410 (e.g. having m D-FFs), and a first remainder processing unit (Logic-2) 1408.

The logic for Logic-2 1406 may be given by Eq. (59):

$$\begin{bmatrix} r_0 \\ r_1 \\ r_2 \\ \vdots \\ r_{m-2} \\ r_{m-1} \end{bmatrix} = \begin{bmatrix} g_0 & 0 & 0 & \vdots & \vdots & 0 \\ g_1 & g_0 & 0 & 0 & \vdots & \vdots \\ g_2 & g_1 & g_0 & 0 & 0 & \vdots \\ \vdots & \vdots & \vdots & \vdots & \vdots & \vdots \\ \vdots & \vdots & \vdots & \vdots & \vdots & 0 \\ g_{m-1} & \vdots & \vdots & \vdots & g_1 & g_0 \end{bmatrix} \cdot \begin{bmatrix} q_0 \\ q_1 \\ q_2 \\ \vdots \\ q_{m-2} \\ q_{m-1} \end{bmatrix} \quad \text{Eq. (59)}$$

For the pipeline architecture described above, the last iteration is slightly different, and may be computed according to non-pipelines architectures. The reason for that is that if the pipeline architecture would be carried also in the last iteration, the remainder $r_m$ computed in the last iteration will be associated with negative coefficients of the original polynomial, and this is to be avoided. Therefore the last iteration will be computed as a non-pipelined architecture, replacing $G_{2p,p}^{-1}$ by $G_p^{-1}$, and computing $q_p = G_p^{-1} w_{p,i}$ instead of $q_{2p,i} = G_{2p,p}^{-1} w_{p,i}$ and computing $r_m = G_m q_p$ with an m×p matrix $G_m$, instead of $r_{m,i} = G_m q_{2p,i-1}$, (with an m×2p matrix $G_m$).

Figure 15:
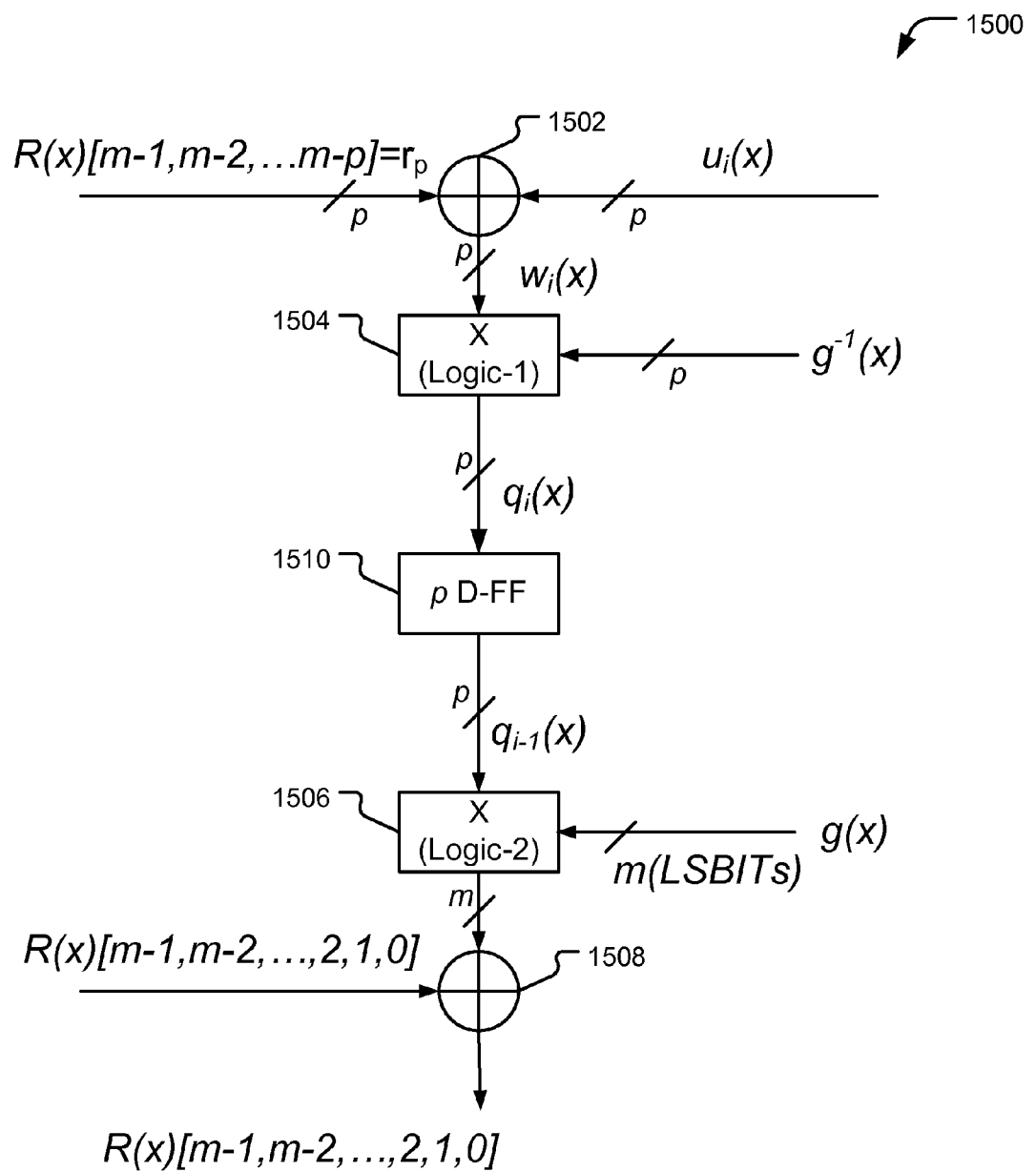
FIG. 15 is a block diagram of an embodiment of a system configured to perform a last step of a pipelined multi-stage polynomial division operation when a number of terms of a divisor is greater than a number of dividend terms evaluated during prior pipeline division stages.

FIG. 15 depicts a system 1500 configured to perform a last step of a pipelined multi-stage polynomial division operation when m>p. The system 1500 includes a first adder 1502, a quotient processing unit (Logic-1) 1504, a pipeline buffer 1510 (e.g. having p D-FFs), a first remainder processing unit (Logic-2) 1506, and a second adder 1508. The system of FIG. 15 is almost identical to the non-pipelined scheme presented in FIG. 5. A notable difference is that the output R(x) is added to the previous R(x) without any adjustment of the indices, because the last iteration's output is related to the same indices of R(x) as the previous pipelined iteration.

Figure 16:
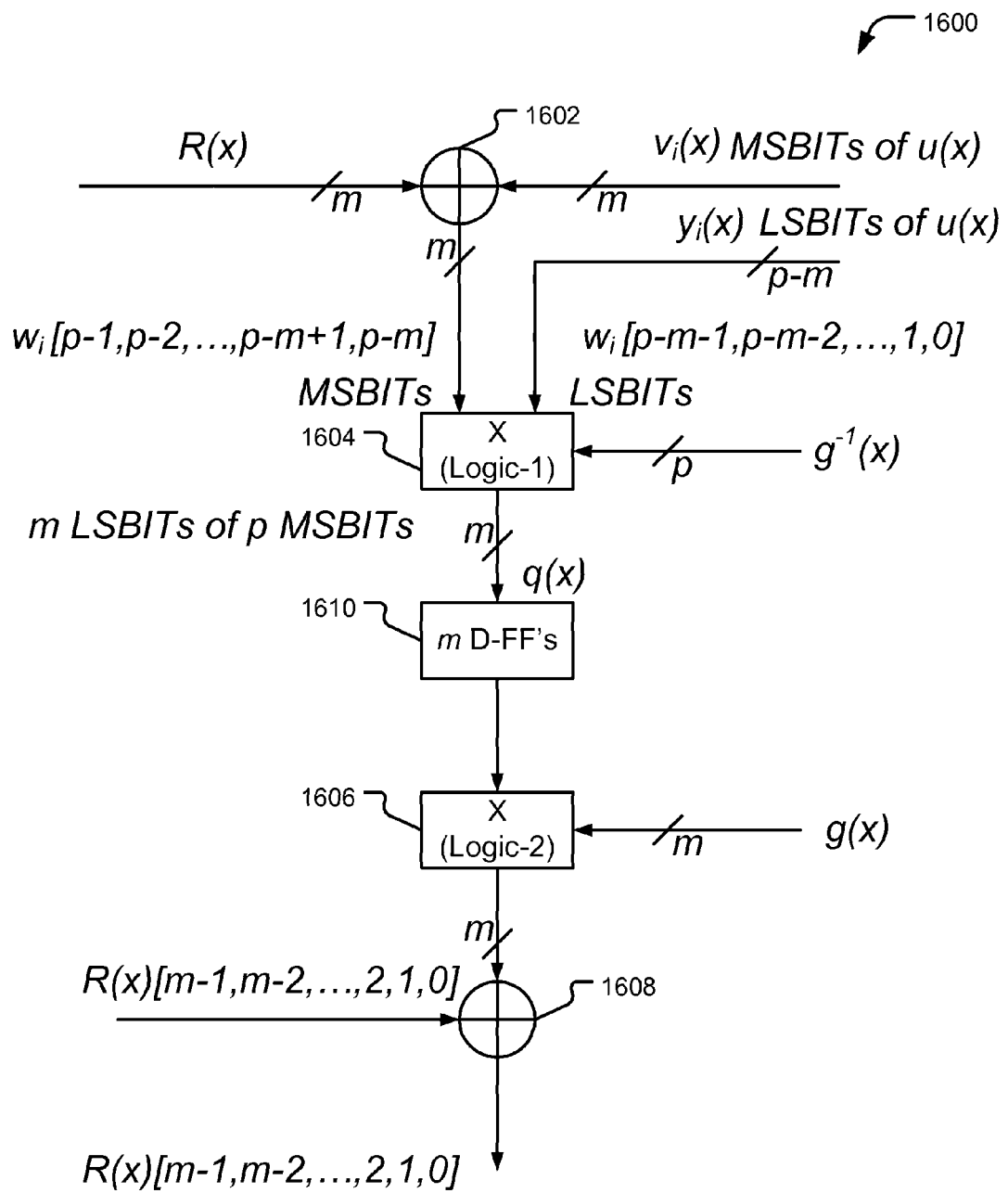
FIG. 16 is a block diagram of an embodiment of a system configured to perform a last step of a pipelined multi-stage polynomial division operation when a number of terms of a divisor is less than a number of dividend terms evaluated during prior pipeline division stages.

For m<p the last step exception is slightly different. The hardware scheme of FIG. 15 may be used if R(x)[m−1, m−2, ..., m−p] is interpreted as a concatenation of p−m zeros to R(x)[m−1, m−2, ..., 0] (as lower coefficients). Alternatively, another system based on FIG. 9 may be used, as depicted in FIG. 16. FIG. 16 depicts a system 1600 that includes a first adder 1602, a quotient processing unit (Logic-1) 1604, a pipeline buffer 1610 (e.g. having m D-FFs), a first remainder processing unit (Logic-2) 1606, and a second adder 1608.

Figure 17:
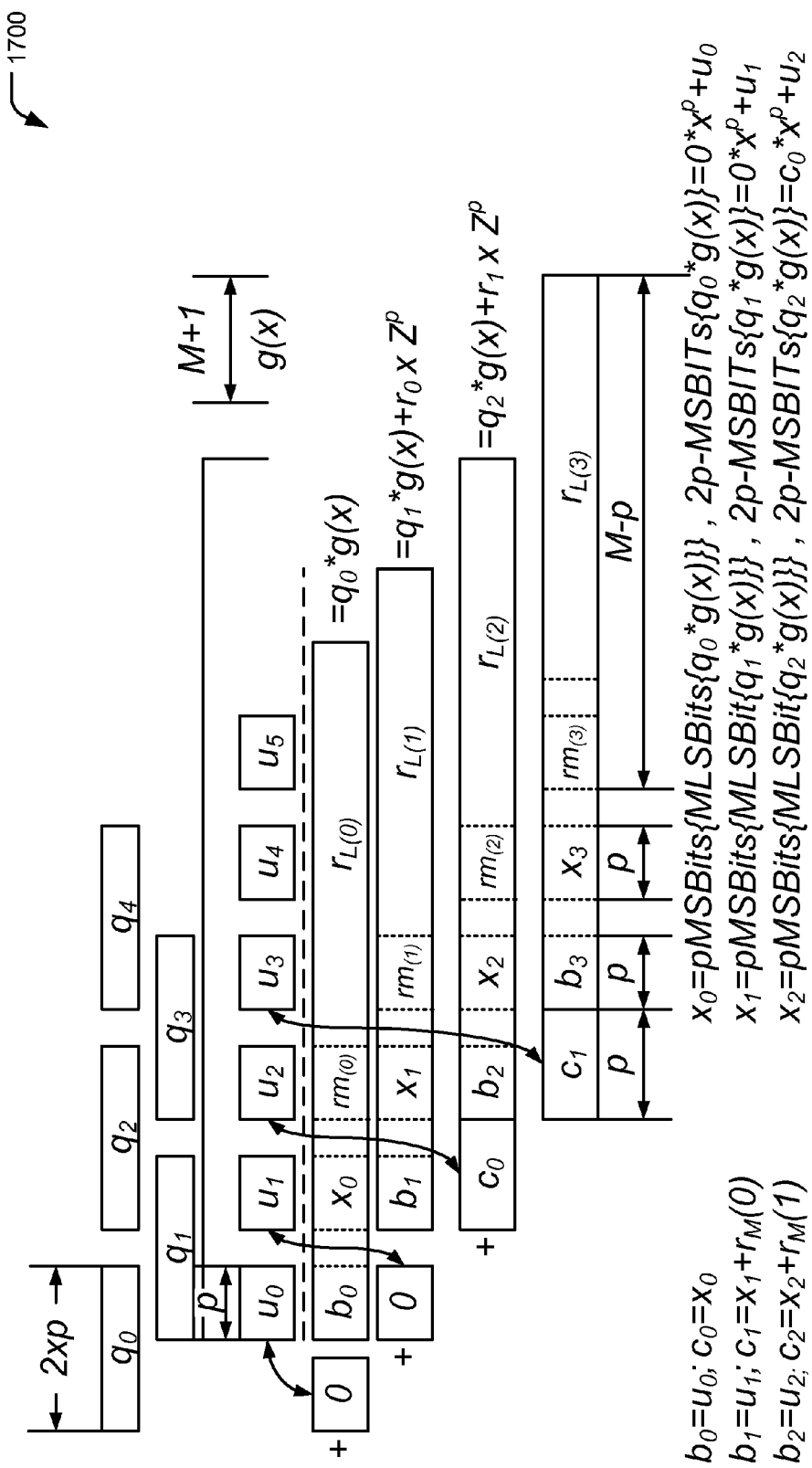
FIG. 17 is a general diagram of another embodiment of a pipelined multi-stage polynomial division operation.
Figure 18:
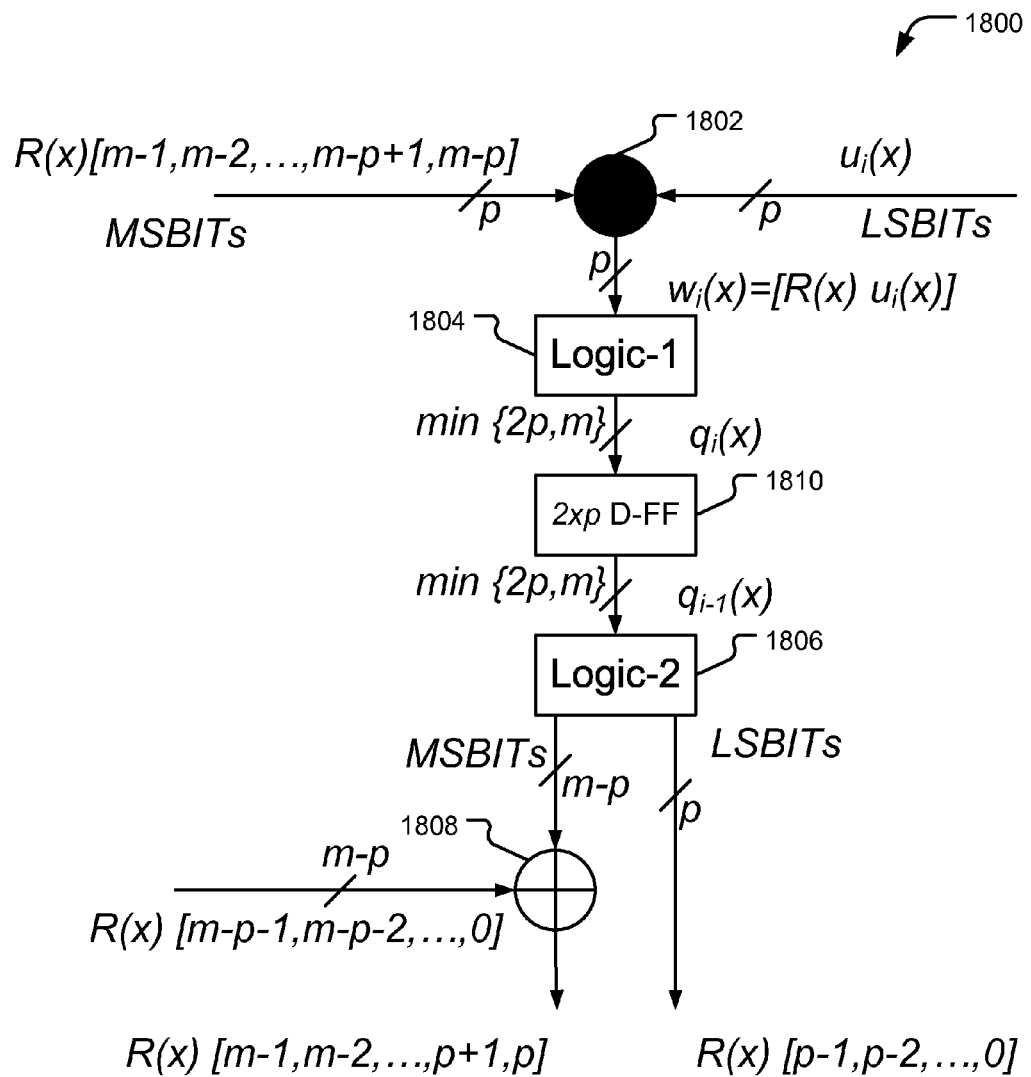
FIG. 18 is a block diagram of an embodiment of a system configured to perform the pipelined multi-stage polynomial division operation of FIG. 17 when a number of terms of a divisor is greater than a number of dividend terms evaluated during a pipeline division stage.

Another pipeline architecture may be presented where at each iteration 2p coefficients of a q vector are computed, p of the coefficients related to the u vector of the current iteration, and the other p coefficients related to the r coefficients of the previous iteration. The coefficients were computed with a delay and were not ready in the previous iteration. A general diagram of this pipeline architecture is depicted in FIG. 17, and a hardware implementation is depicted in FIG. 18, where the full circle at the top of the figure denotes vector concatenation.

The explicit equations of this pipeline architecture for m>p are given by Eqs. (60) and (61):

$$q_{2p,i} = G_{2p}^{-1} \begin{pmatrix} w_{p,i} \\ r_{p,i-1} \end{pmatrix} \qquad (60)$$

$$r_{m,i} = G_m q_{2p,i-1}. \qquad (61)$$

In this case, the m elements of r should be added to m−p elements of the previous r in the staggered fashion that was introduced in the non-pipe-line architecture that was presented in FIG. 5.

For m<p, only m elements of $q_{2p,i}$ need to be computed, (again assuming we are only interested in the remainder), so only m rows of $G_{2p}^{-1}$ need to be computed, and the equations can be modified as given in Eqs. (62) and (63):

$$q_{m,i} = G_{2p,m}^{-1} \begin{pmatrix} w_{p,i} \\ r_{p,i-1} \end{pmatrix} \qquad (62)$$

and $$r_{m,i} = G_m q_{m,i-1} \qquad (63)$$

The pipe operation is depicted as operation 1700 in FIG. 17.

A system 1800 for calculating a result in the case of m>p is depicted in FIG. 18. The system 1800 includes a first adder 1802 that performs vector concatenation rather than finite field addition, a quotient processing unit (Logic-1) 1804, a pipeline buffer 1810 (e.g. having 2×p D-FFs), a first remainder processing unit (Logic-2) 1806, and a second adder 1808. In FIG. 18, $g^{-1}(x)$ is computed in the same way as in equation (52) while Logic-1 1804 is given by Eq. (64) and Logic-2 1808 is the same as previously given in Eq. (57).

$$\begin{bmatrix} q_0 \\ q_1 \\ q_2 \\ \vdots \\ \vdots \\ \vdots \\ q_{2p-3} \\ q_{2p-2} \\ q_{2p-1} \end{bmatrix} = \qquad \text{Eq. (64)}$$

$$\begin{bmatrix} 1 & g_{2p-2}^{-1} & \vdots & \vdots & g_2^{-1} & g_1^{-1} & g_0^{-1} \\ 0 & 1 & g_{2p-2}^{-1} & \vdots & \vdots & g_3^{-1} & g_2^{-1} & g_1^{-1} \\ 0 & 0 & 1 & \vdots & \vdots & \vdots & g_3^{-1} & g_2^{-1} \\ \vdots & \vdots & \vdots & \vdots & \vdots & \vdots & \vdots & g_3^{-1} \\ \vdots & \vdots & \vdots & \vdots & \vdots & \vdots & \vdots & \vdots \\ \vdots & \vdots & \vdots & \vdots & g_{2p-3}^{-1} & \vdots & \vdots & \vdots \\ \vdots & \vdots & \vdots & \vdots & g_{2p-2}^{-1} & g_{2p-3}^{-1} & \vdots & \vdots \\ \vdots & \vdots & \vdots & 0 & 1 & g_{2p-2}^{-1} & g_{2p-3}^{-1} & \vdots \\ 0 & \vdots & \vdots & 0 & 0 & 1 & g_{2p-2}^{-1} \\ 0 & \vdots & \vdots & 0 & 0 & 0 & 1 \end{bmatrix} \cdot \begin{bmatrix} w_0 \\ w_1 \\ w_2 \\ \vdots \\ \vdots \\ \vdots \\ \vdots \\ w_{2p-3} \\ w_{2p-2} \\ w_{2p-1} \end{bmatrix}$$

Figure 19:
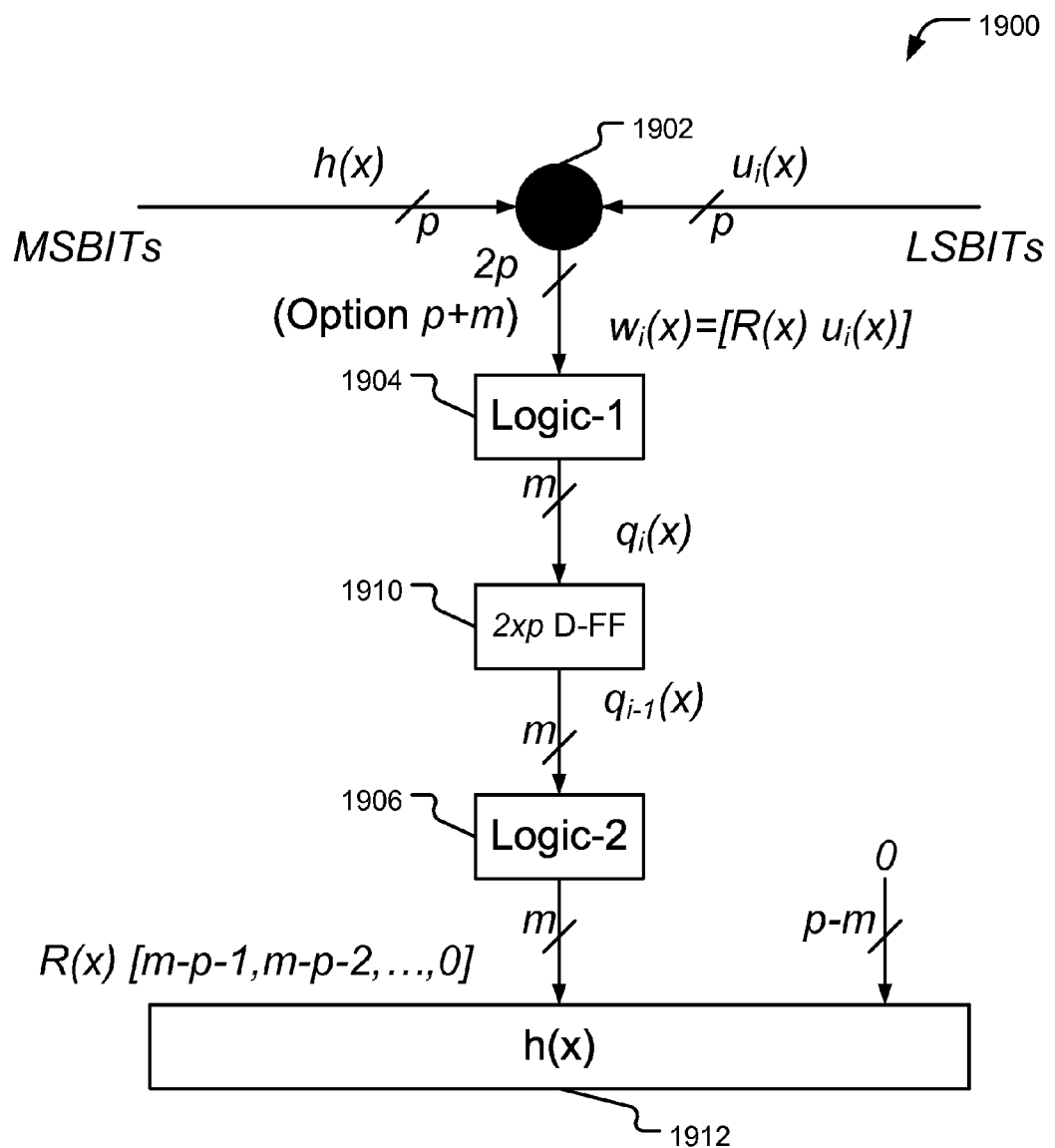
FIG. 19 is a block diagram of an embodiment of a system configured to perform the pipelined multi-stage polynomial division operation of FIG. 17 when a number of terms of a divisor is less than a number of dividend terms evaluated during a pipeline division stage.

FIG. 19 is a block diagram of an embodiment of a system 1900 configured to perform the pipelined multi-stage polynomial division operation of FIG. 17 when a number of terms of a divisor is less than a number of dividend terms evaluated during a pipeline division stage (i.e., m<p). The system 1900 includes a first adder 1902 that performs vector concatenation rather than finite field addition, a quotient processing unit (Logic-1) 1904, a pipeline buffer 1910 (e.g. having 2×p D-FFs), a first remainder processing unit (Logic-2) 1906, and a register 1912. For the case of m<p, Logic-2 1906 and Logic-1 1904 are the same as the Logic-1 1804 and Logic-2 1806 of FIG. 18. Note that some simplification can be done for Logic-1 1904 given by Eq. (64) when taking into consideration that p−m zeros exists in the p−m LSBits of the p MSBits of vector w of length 2×p, so actually only p+m inputs are used and the columns with indices {p+1, p+2, ..., 2p−m} of $G_{2p,m}^{-1}$ are erased.

For the optional pipeline architecture, the last iteration is different than the last iteration in both the previous pipeline and the nonpipeline, and is computed according to the non-pipeline architectures. The last iteration is computed as a non-pipelined architecture, replacing $G_{2p,p}^{-1}$ by $G_p^{-1}$, and replacing the input $(w_{p,i}\ r_{p,i-1})^T$ by $r_{p,i-1}$, and by computing $q_{p}=G_p^{-1}r_{p,i}$ instead of $q_{2p,i}=G_{2p}^{-1}(w_{p,i}\ r_{p,i-1})^T$ and computing $r_{m,i}=G_m q_p$ with an m×p matrix $G_m$, instead of $r_{m,i}=G_m q_{2p,i-1}$, (with an m×2p matrix $G_m$).

Figure 20:
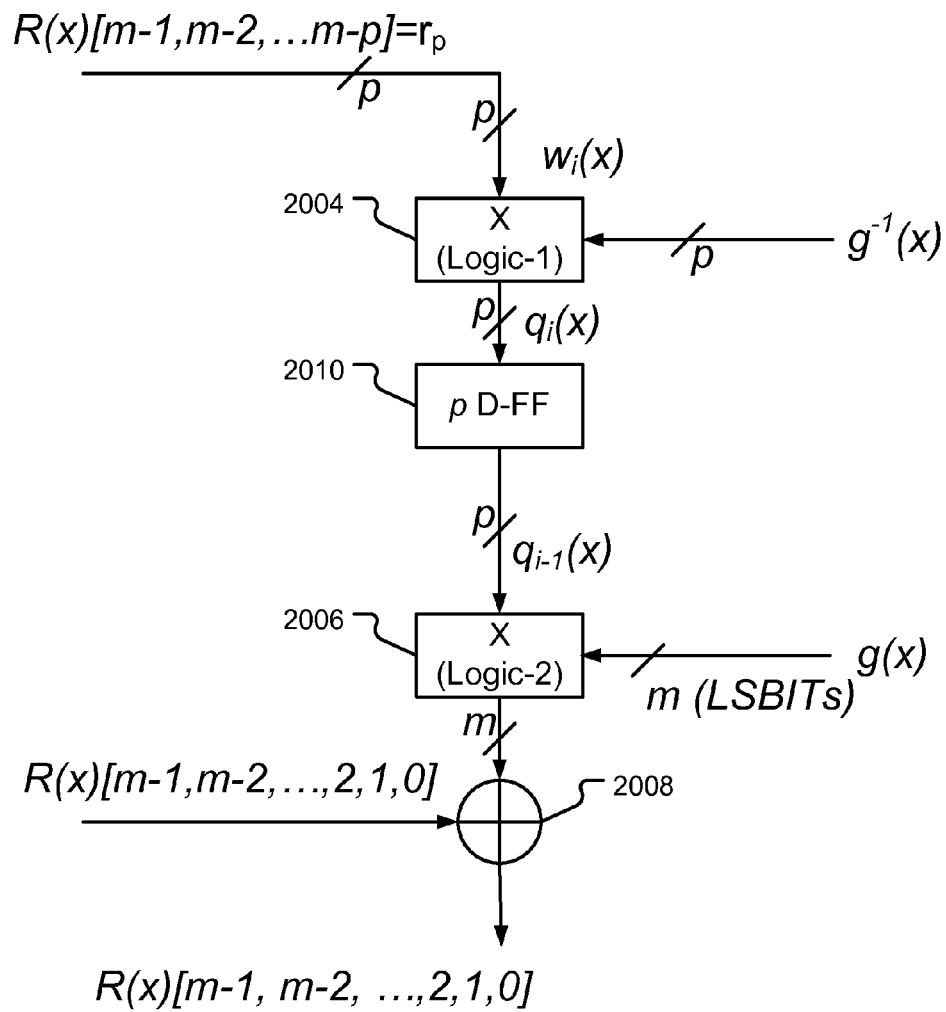
FIG. 20 is a block diagram of an embodiment of a system configured to perform a last step of the pipelined multi-stage polynomial division operation of FIG. 17 when a number of terms of a divisor is greater than a number of dividend terms evaluated during prior pipeline division stages.

FIG. 20 depicts a system 2000 configured to perform a last step of the pipelined multi-stage polynomial division operation 1700 of FIG. 17 when m>p. The system 2000 includes a quotient processing unit (Logic-1) 2004, a pipeline buffer 2010 (e.g. having p D-FFs), a first remainder processing unit (Logic-2) 2006, and an adder 2008. The system 2000 of FIG. 20 is almost identical to the non-pipelined scheme presented in FIG. 5. A notable difference is that the output R(x) is added to the previous R(x) without any adjustment of the indices, because the last iteration's output is related to the same indices of R(x) as the previous pipelined iteration. Also, in the system 2000, the input to the last iteration is just the remainder R(x), because the inputs u(x) were already all considered in the previous iterations.

Figure 21:
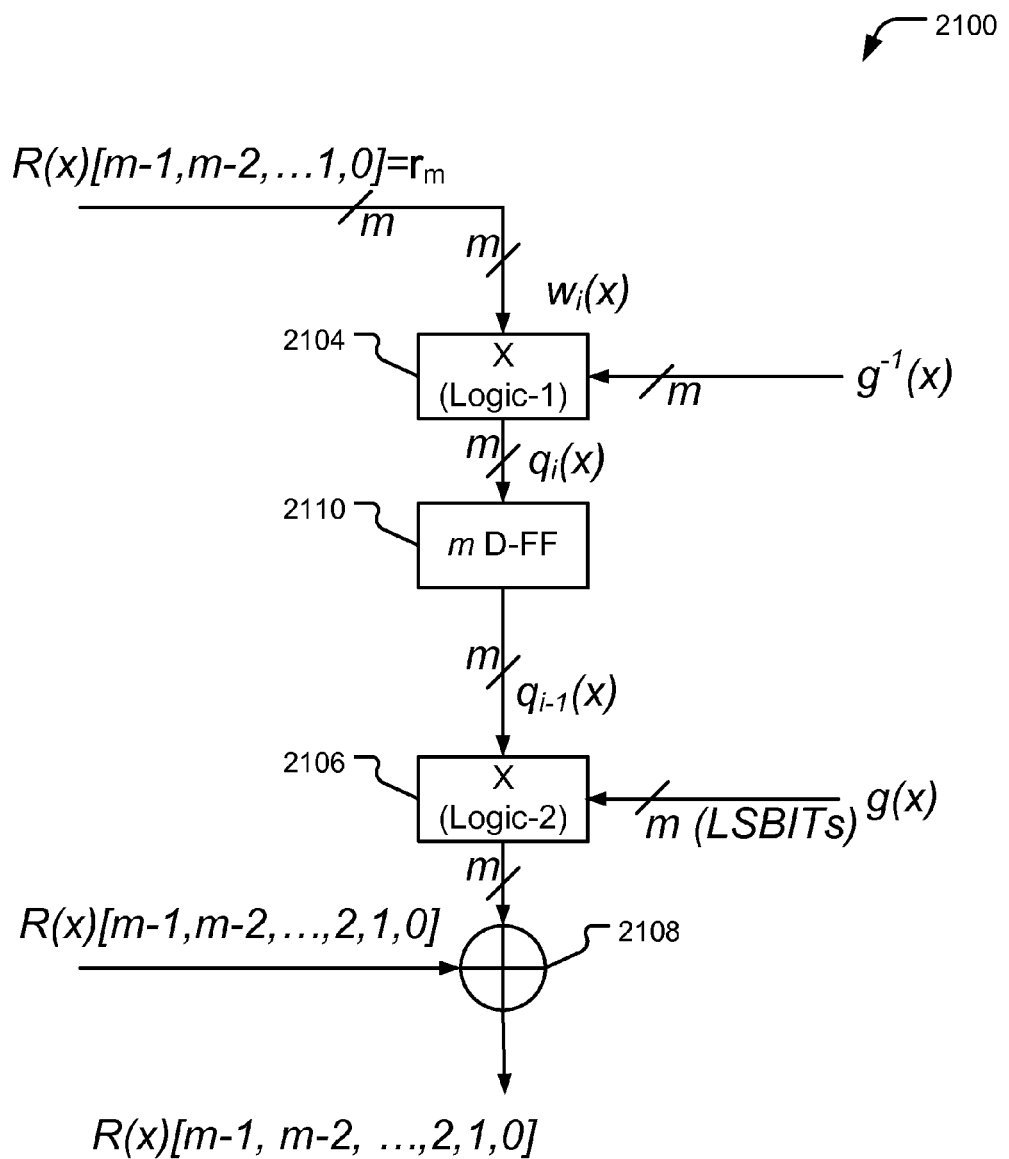
FIG. 21 is a block diagram of an embodiment of a system configured to perform a last step of a pipelined multi-stage polynomial division operation when a number of terms of a divisor is less than a number of dividend terms evaluated during prior pipeline division stages.

FIG. 21 depicts a system 2100 configured to perform a last step of the pipelined multi-stage polynomial division operation 1700 of FIG. 17 when m<p. The system 2100 includes a quotient processing unit (Logic-1) 2104, a pipeline buffer 2110 (e.g. having p D-FFs), a first remainder processing unit (Logic-2) 2106, and an adder 2108.

Figure 22:
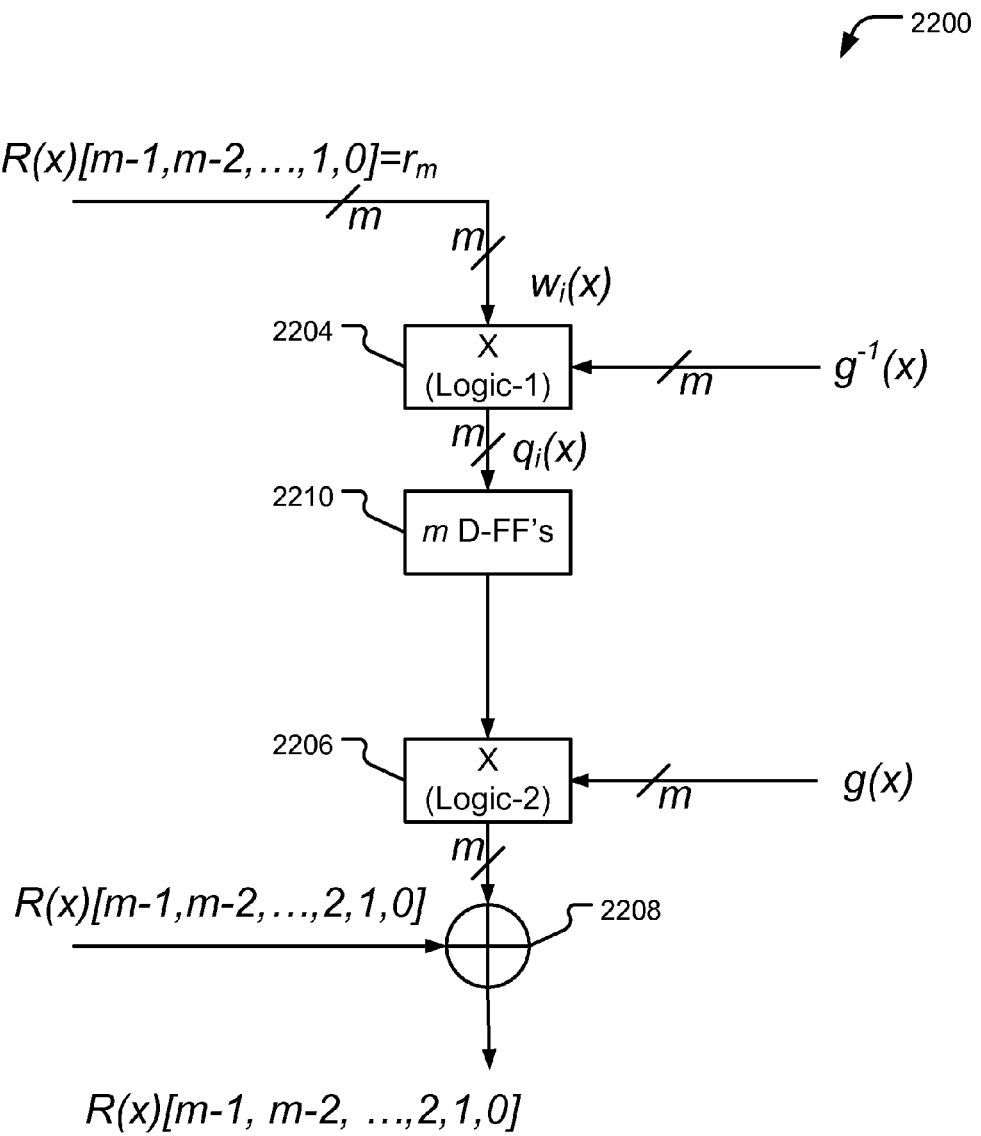
FIG. 22 is a block diagram of an embodiment of a system configured to perform a last step of a pipelined multi-stage polynomial division operation when a number of terms of a divisor is equal to a number of dividend terms evaluated during prior pipeline division stages.

FIG. 22 depicts a system 2200 configured to perform a last step of the pipelined multi-stage polynomial division operation 1700 when m=p. The system 2100 includes a quotient processing unit (Logic-1) 2204, a pipeline buffer 2210 (e.g. having m D-FFs), a first remainder processing unit (Logic-2) 2206, and an adder 2208. In the case of FIG. 22, the Logic-1 2204 is defined by solving the equation given by Eq. (23) while substituting p=m.

Figure 23:
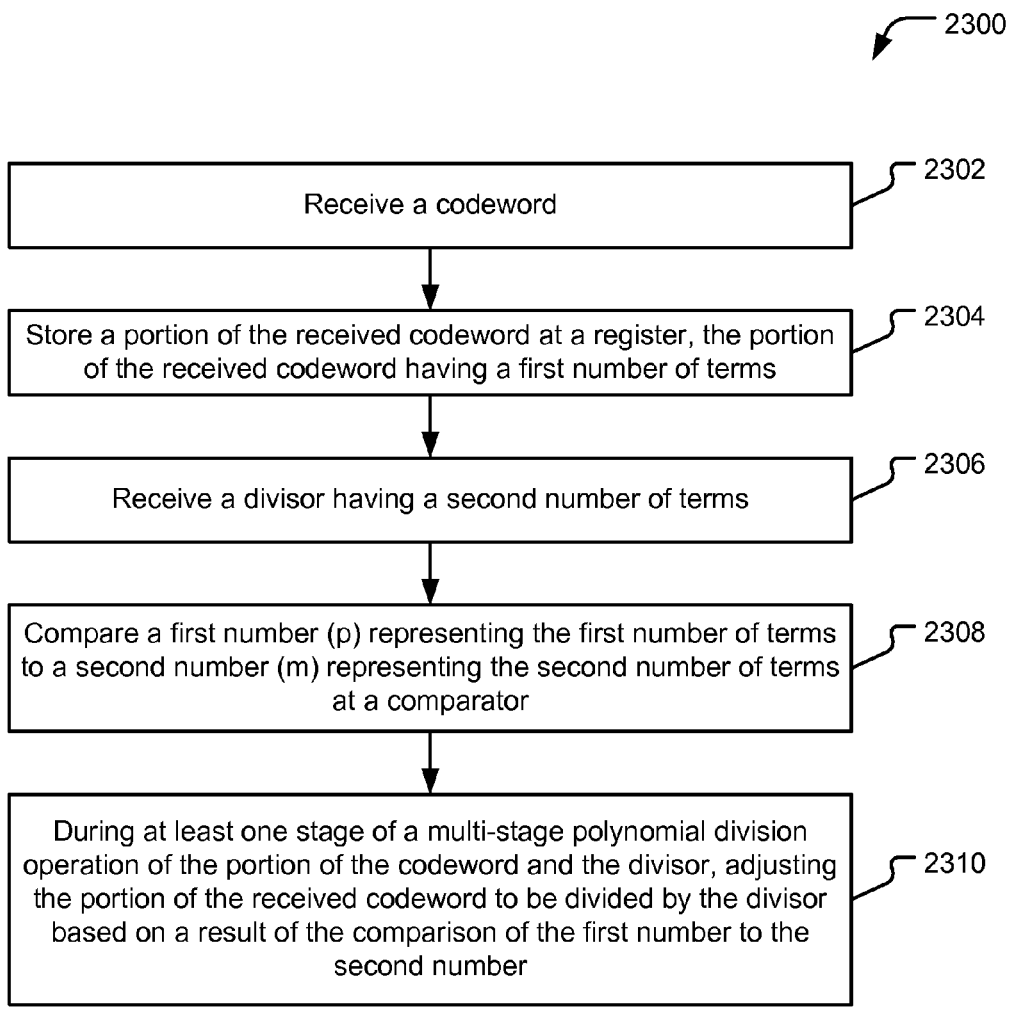
FIG. 23 is a flow chart of a first embodiment of a method to perform multi-stage polynomial division.

Referring to FIG. 23, a flow chart of a first embodiment of a method to perform multi-stage polynomial division is depicted and generally designated 2300. A codeword is received, at 2302. For example, the codeword may be the codeword 204 that is received at the multi-stage polynomial division apparatus 202 of FIG. 2.

A portion of the received codeword is stored at a register, at 2304. For example, the portion of the received codeword may be the portion 206 of the received codeword 204 of FIG. 2. The portion of the received codeword has a first number of terms. A divisor having a second number of terms is also received, at 2306. For example, the divisor may be the divisor 203 of FIG. 2. To illustrate, the divisor may represent a generator function of a Bose-Chaudhuri-Hocquenghem (BCH) encoder, a Reed-Solomon (RS) encoder, or a cyclic code encoder.

A first number p representing the first number of terms is compared to a second number m representing the second number of terms at a comparator, at 2308. For example, the comparator may be the comparator 260 of FIG. 2 that compares the first number p 262 to the second number m 264.

During at least one stage of a multi-stage polynomial division operation using the portion of the codeword and the divisor, the portion of the received codeword to be divided by the divisor is adjusted based on a result of the comparison of the first number p to the second number m, at 2310. For example, the adjustment unit 222 of FIG. 2 may configure the adder 240 to adjust the m most significant terms of the portion 206 of the codeword 204 when p is greater than m or to adjust all terms of the portion 206 of the codeword 204 when p is less than or equal to m.

Figure 24:
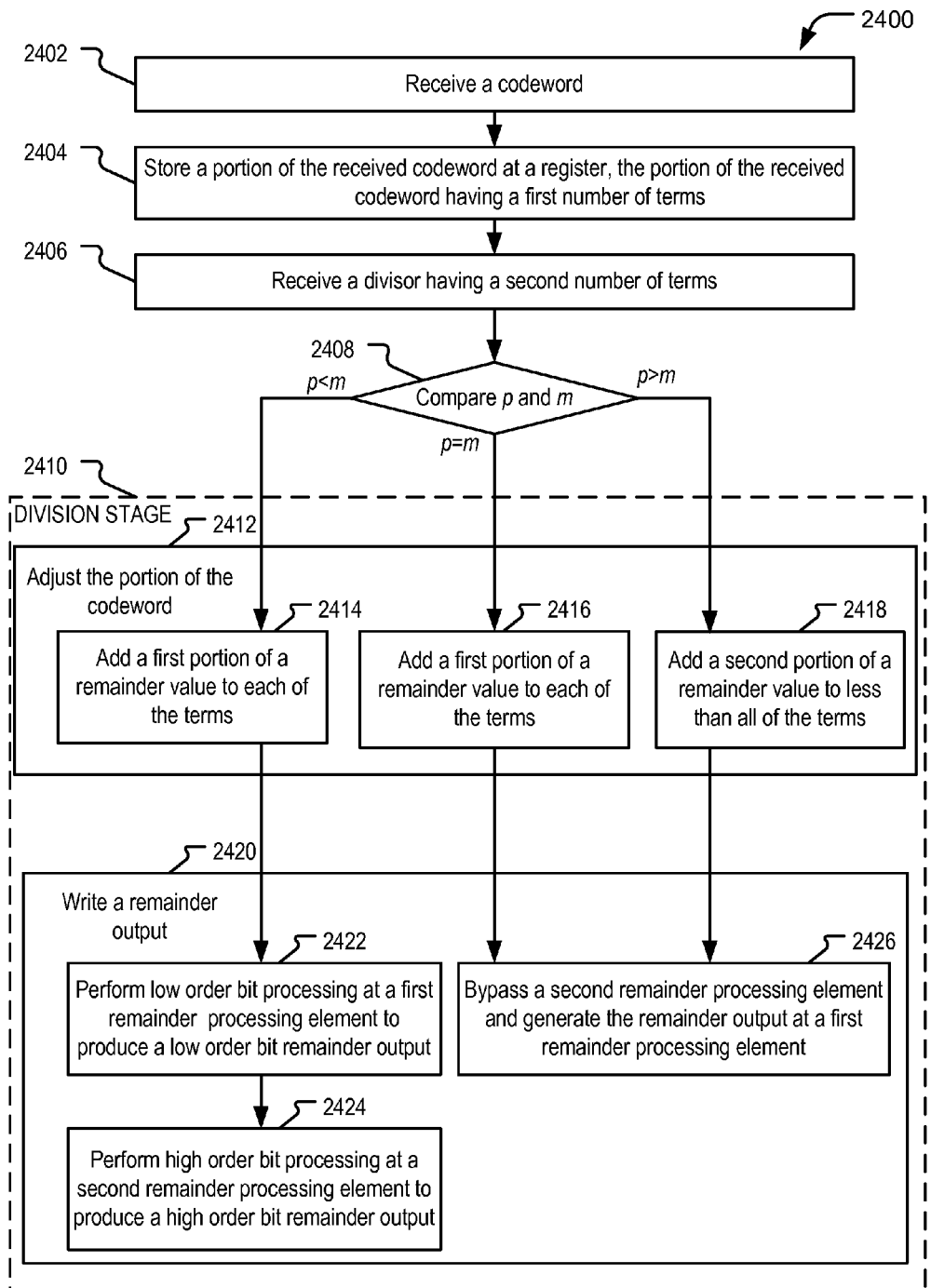
FIG. 24 is a flow chart of a second embodiment of a method to perform multi-stage polynomial division.

Referring to FIG. 24, a flow chart of a second embodiment of a method to perform multi-stage polynomial division is depicted and generally designated 2400. A codeword is received, at 2402. For example, the codeword may be the codeword 304 that is received at the multi-stage polynomial division apparatus 302 of FIG. 3.

A portion of the received codeword is stored at a register, at 2404. For example, the portion of the received codeword may be the portion 306 of the received codeword 304 of FIG. 3. The portion of the received codeword has a first number of terms. A divisor having a second number of terms is also received, at 2406. For example, the divisor may be the divisor 303 of FIG. 3. To illustrate, the divisor may represent a generator function of a Bose-Chaudhuri-Hocquenghem (BCH) encoder, a Reed-Solomon (RS) encoder, or a cyclic code encoder.

A comparison is made of a first number p representing the first number of terms to a second number m representing the second number of terms, at 2408. The comparison may be performed prior to a first sequential stage of the multi-stage polynomial division operation and all portions of the received codeword may be processed using the received divisor. For example, the comparison may be performed at the comparator 360 of FIG. 3 based on the number of terms m of the divisor 303 prior to configuring the input dividend generator 328 to begin processing the codeword 304. At least one stage 2410 of a multi-stage polynomial division operation using the portion of the codeword and the divisor is performed based on the comparison.

The portion of the received codeword to be divided by the divisor is adjusted based on a result of the comparison of the first number p to the second number m, at 2412. When the first number is less than the second number (p<m), adjusting the portion of the received codeword may include adding a first portion of a remainder value to each of the terms of the portion of the received codeword, at 2414. When the first number is equal to the second number (p=m), adjusting the portion of the received codeword may include adding a first portion of a remainder value to each of the terms of the portion of the received codeword, at 2416. When the first number is greater than the second number (p>m), adjusting the portion of the received codeword includes adding a second portion of a remainder value to less than all of the terms of the portion of the received codeword, at 2418. For example, the adjustment unit 222 of FIG. 2 may configure the adder 240 to adjust the m most significant terms of the portion 206 of the codeword 204 when p is greater than m or to adjust all terms of the portion 206 of the codeword 204 when p is less than or equal to m.

During the at least one stage 2410, a remainder output of the at least one stage may be written to a second register to store a remainder value based on the result of the comparison of the first number p to the second number m, at 2420. When the second number m is greater than the first number p(m>p), the remainder output of the at least one stage may be generated by performing low order bit processing at a first remainder processing element to produce a low order bit remainder output, at 2422, and performing high order bit processing at a second remainder processing element to produce a high order bit remainder output, at 2424. The first remainder processing element is distinct from the second remainder processing element. For example, the first remainder processing element may be the first remainder processing element 312 of FIG. 3 and the second remainder processing element may be the second remainder processing element 314 of FIG. 3.

When the second number m is less than or equal to the first number p(m≦p), the second remainder processing element may be bypassed and the remainder output of the at least one stage 2410 is generated by the first remainder processing element, at 2426. For example, the bypass logic 332 of FIG. 3 may be responsive to the comparator 360 to bypass the second remainder processing unit 314 when m≦p.

Figure 25:
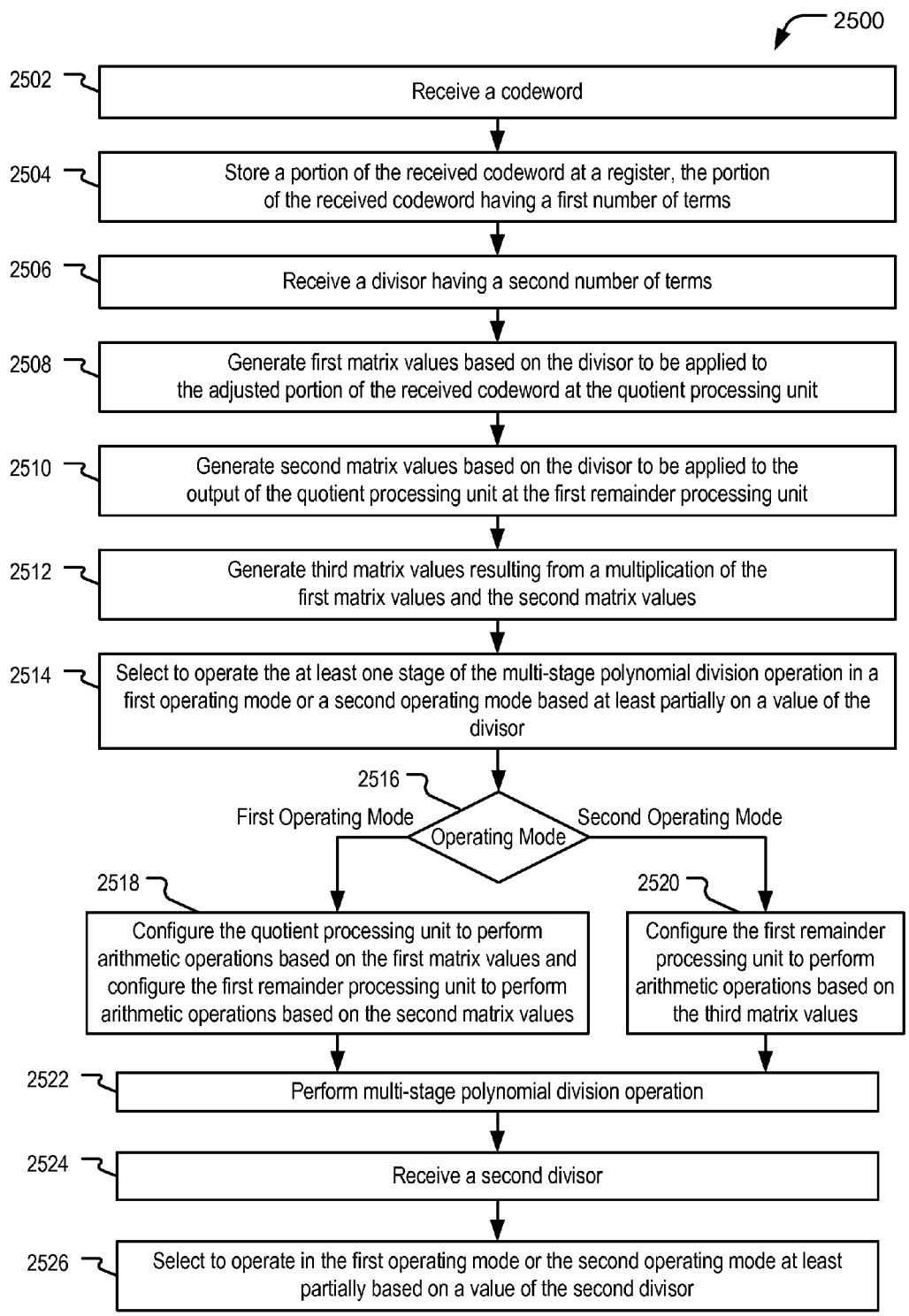
FIG. 25 is a flow chart of a third embodiment of a method to perform multi-stage polynomial division.

Referring to FIG. 25, a flow chart of a third embodiment of a method to perform multi-stage polynomial division is depicted and generally designated 2500. A codeword is received, at 2502. For example, the codeword may be the codeword 304 that is received at the multi-stage polynomial division apparatus 302 of FIG. 3.

A portion of the received codeword is stored at a register, at 2504. For example, the portion of the received codeword may be the portion 306 of the received codeword 304 of FIG. 3. The portion of the received codeword has a first number of terms. A divisor having a second number of terms is also received, at 2506. For example, the divisor may be the divisor 303 of FIG. 3.

First matrix values may be generated based on the divisor to be applied to the adjusted portion of the received codeword at the quotient processing unit, at 2508. Second matrix values may be generated based on the divisor to be applied to the output of the quotient processing unit at the first remainder processing unit, at 2510. Third matrix values resulting from a multiplication of the first matrix values and the second matrix values may be generated, at 2512. For example, the first, second, and third matrix values may be generated by configuration logic unit 326 of FIG. 3.

A selection may be made to operate the at least one stage of the multi-stage polynomial division operation in a first operating mode or a second operating mode based at least partially on a value of the divisor, at 2514. The first operating mode includes performing a quotient processing operation at a quotient processing unit and providing an output of the quotient processing unit to a first remainder processing unit, and the second operating mode includes bypassing the quotient processing unit. For example, the selection may be made by the configuration logic unit 326 of FIG. 3 that configures the switching element 323 to selectively bypass the quotient processing unit 324. To illustrate, the configuration logic unit 326 of FIG. 3. may select whether to operate in a first operating mode or a second operating mode based on a at least one of a first sparseness of the first matrix values or a second sparseness of the second matrix values as compared to a third sparseness of the third matrix values. The first, second, and third matrix values may be generated based on a value of the divisor, as described with respect to FIGS. 5 and 6. As another example, selecting to operate in the first operating mode or the second operating mode may be based on a first complexity value corresponding to applying the first matrix values and the second matrix values in a parallel computing system as compared to a second complexity value corresponding to applying the third matrix values in the parallel computing system.

When the selected operating mode is the first operating mode, at 2516, the quotient processing unit may be configured to perform arithmetic operations based on the first matrix values and the first remainder processing unit may be configured to perform arithmetic operations based on the second matrix values, at 2518. When the selected operating mode is the second operating mode, at 2516, the first remainder processing unit may be configured to perform arithmetic operations based on the third matrix values, at 2520.

After performing a multi-stage polynomial division operation using the selected operating mode, at 2522, a second divisor may be received, at 2524. In response to receiving the second divisor, a selection may be made to operate in the first operating mode or the second operating mode at least partially based on a value of the second divisor, at 2526.

Figure 26:
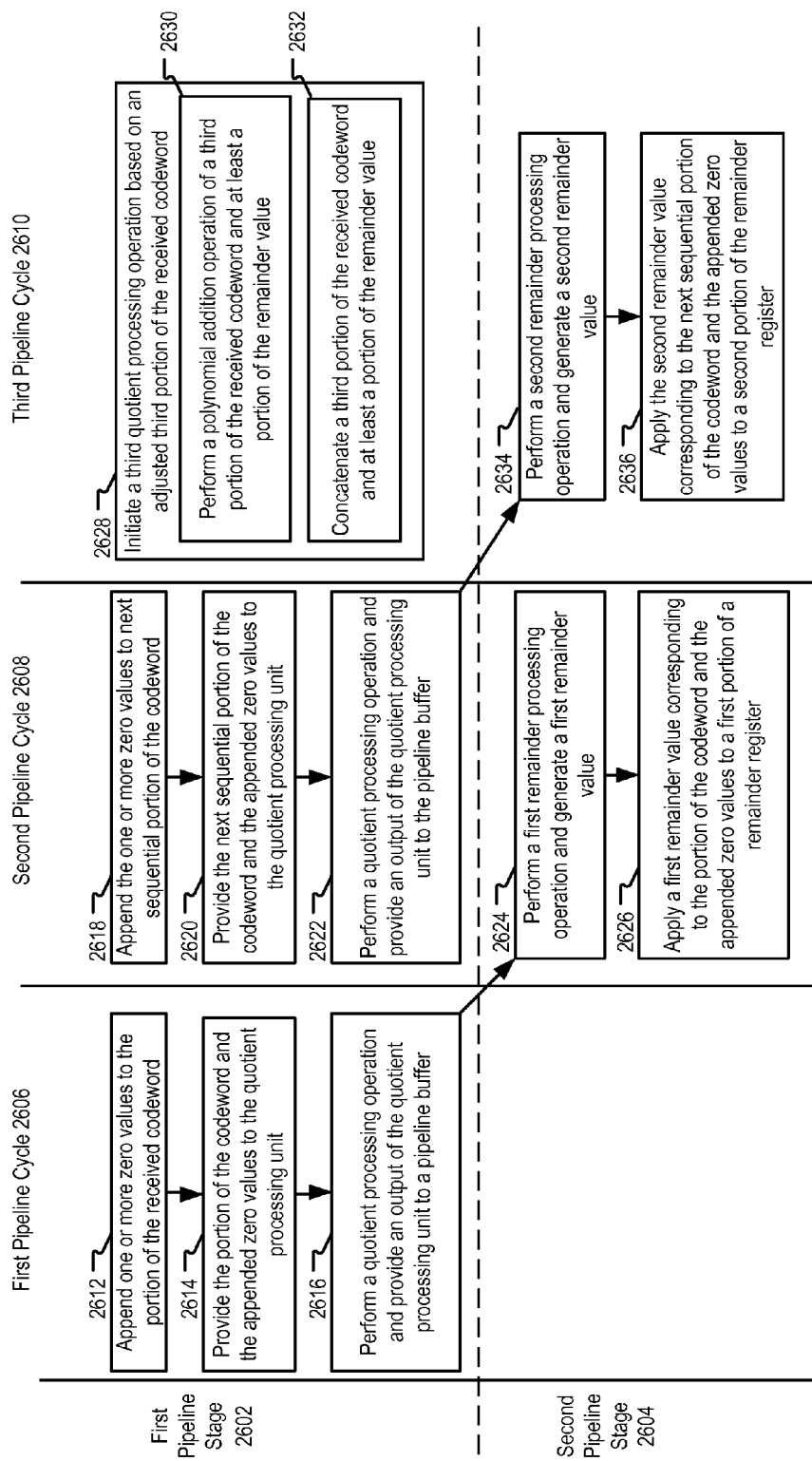
FIG. 26 is a flow chart of an embodiment of a pipeline operation to perform multi-stage polynomial division.

Referring to FIG. 26, a flow chart of an embodiment of a pipeline operation to perform multi-stage polynomial division is depicted and generally designated 2600. The pipeline operation 2600 includes a first pipeline stage 2602 and a second pipeline stage 2604. For example, the first pipeline stage 2602 may include processing performed by the input dividend generator 428 and the quotient processing unit 424 of FIG. 4, and the second pipeline stage 2604 may include processing performed by the first remainder processing unit 412 and the second remainder processing unit 414 of FIG. 4. The pipeline operation 2600 may process sequential portions of a codeword, each portion having a first number p of terms, based on a divisor having a second number m of terms.

During a first pipeline cycle 2606, a first quotient processing operation based on an adjusted first portion of the codeword is initiated in the first pipeline stage 2602. One or more zero values are appended to the first portion of the received codeword, at 2612. A number of the appended zero values is determined based on the first number p. The portion of the codeword and the appended zero values are provided to a quotient processing unit, at 2614. The first quotient processing operation is performed at the quotient processing unit and an output of the quotient processing unit is provided to a pipeline buffer, such as the pipeline buffer 436 of FIG. 4, at 2616. For example, the first quotient processing operation may be performed on a received input dividend having number of dividend terms equal to the second number m and the output of the quotient processing unit that is provided to the pipeline buffer includes a number of quotient terms equal to the second number m.

During a second pipeline cycle 2608 following the first pipeline cycle 2606, a second quotient processing operation based on an adjusted second portion of the received codeword is initiated in the first pipeline stage 2602. The one or more zero values are appended to the next sequential portion of the codeword, at 2618, and the next sequential portion of the codeword and the appended zero values are provided to the quotient processing unit, at 2620. The quotient processing operation is performed at the quotient processing unit and an output of the quotient processing unit is provided to the pipeline buffer, at 2622.

Also during the second pipeline cycle 2608, processing of the first portion of the codeword continues at the second pipeline stage 2604. A first remainder processing operation is performed at a first remainder processing unit that accesses the pipeline buffer and generates a remainder value, at 2624. The first remainder processing operation is performed on the output of the quotient processing unit received from the pipeline buffer. A first remainder value corresponding to the first portion of the codeword and the appended zero values is applied to a first portion of a remainder register, at 2626. The first remainder value includes a number of remainder terms equal to the second number m.

During a third pipeline cycle 2610 following the second pipeline cycle 2608, a third quotient processing operation is initiated in the first pipeline stage 2602. The third quotient processing operation is based on an adjusted third portion of the received codeword, at 2628. For example, the third quotient processing operation may include performing a polynomial addition operation of a third portion of the received codeword and at least a portion of the first remainder value to generate the adjusted third portion of the received codeword, at 2630, such as described with respect to FIGS. 11-12 and FIGS. 13-16. As another example, the third quotient processing operation may include concatenating a third portion of the received codeword and at least a portion of the first remainder value to generate the adjusted third portion of the received codeword, at 2632, such as described with respect to FIGS. 17-19.

Also during the third pipeline cycle 2610, processing of the second portion of the codeword continues at the second pipeline stage 2604. A second remainder processing operation is performed at the first remainder processing unit that accesses the pipeline buffer and generates the second remainder value, at 2634. The second remainder processing operation is performed on the output of the quotient processing unit received from the pipeline buffer. The second remainder value corresponding to the next sequential portion of the codeword (i.e., the second portion of the codeword) and the appended zero values is applied to a second portion of the remainder register, at 2636. The first portion of the remainder register and the second portion of the remainder register partially overlap.

As described with respect to FIGS. 11-19, by appending zero values or concatenating a portion of an earlier remainder value to the received codewords, a remainder value that will result from an operation starting in one pipeline cycle will not be used in the following pipeline cycle, enabling the pipelined operation depicted in FIG. 26. To illustrate, the first remainder value that is generated during the second pipeline cycle 2608 is used to generate the adjusted third portion of the received codeword during the third pipeline cycle 2610 but is not used to generate the adjusted second portion of the received codeword during the second pipeline cycle 2608.

The present disclosure is applicable to polynomial division over any field. However, the examples and block diagrams were given for the underlying field GF(2). Therefore any addition operations in the examples and block diagrams, are implemented as XOR-s (or addition modulo 2), and the multiplications of elements of the field are given by AND.

Although various components depicted herein are illustrated as block components and described in general terms, such components may include one or more microprocessors, state machines, or other circuits configured to enable performance of the particular functions attributed to such components. For example, the first remainder processing unit 112 of FIG. 1 may represent physical components, such as hardware controllers, state machines, logic circuits, or other structures to enable the first remainder processing unit 112 of FIG. 1 to generate a remainder output during a multi-stage polynomial division operation.

For example, the first remainder processing unit 112 may be implemented using a microprocessor or microcontroller programmed to generate a remainder output during a multi-stage polynomial division operation. In a particular embodiment, the first remainder processing unit 112 of FIG. 1 includes executable instructions that are executed by a processor and the instructions are stored at a memory. Alternatively, or in addition, executable instructions that are executed by a processor that may be included in or accessible to the multi-stage polynomial division apparatus 102 of FIG. 1, such as at a random access memory (RAM), a read-only memory (ROM), or other memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:
1. A multi-stage polynomial division method comprising:
receiving a codeword;
storing a portion of the received codeword at a register, the portion of the received codeword having a first number of terms;
receiving a divisor having a second number of terms;

comparing a first number representing the first number of terms to a second number representing the second number of terms at a comparator; and during at least one stage of a multi-stage polynomial division operation using the portion of the codeword and the divisor, adjusting the portion of the received codeword to be divided by the divisor based on a result of the comparison of the first number to the second number.

2. The method of claim 1, wherein the comparison is performed prior to a first sequential stage of the multi-stage polynomial division operation and wherein all portions of the received codeword are processed using the received divisor.

3. The method of claim 1, wherein adjusting the portion of the received codeword includes adding a first portion of a remainder value to each of the terms of the portion of the received codeword when the first number is less than or equal to the second number.

4. The method of claim 1, wherein adjusting the portion of the received codeword includes adding a second portion of a remainder value to less than all of the terms of the portion of the received codeword when the first number is greater than the second number.

5. The method of claim 1, further comprising, during the at least one stage, writing a remainder output of the at least one stage to a second register to store a remainder value based on the result of the comparison of the first number to the second number.

6. The method of claim 5, wherein when the second number is greater than the first number, the remainder output of the at least one stage is generated by:
performing low order bit processing at a first remainder processing element to produce a low order bit remainder output; and
performing high order bit processing at a second remainder processing element to produce a high order bit remainder output, wherein the first remainder processing element is distinct from the second remainder processing element.

7. The method of claim 6, wherein when the second number is less than or equal to the first number, the second remainder processing element is bypassed and the remainder output of the at least one stage is generated by the first remainder processing element.

8. The method of claim 1, further comprising selecting to operate the at least one stage of the multi-stage polynomial division operation in a first operating mode or a second operating mode based at least partially on a value of the divisor, wherein the first operating mode includes performing a quotient processing operation at a quotient processing unit and providing an output of the quotient processing unit to a first remainder processing unit, and wherein the second operating mode includes bypassing the quotient processing unit.

9. The method of claim 8, further comprising:
generating first matrix values based on the divisor to be applied to the adjusted portion of the received codeword at the quotient processing unit;
generating second matrix values based on the divisor to be applied to the output of the quotient processing unit at the first remainder processing unit; and
generating third matrix values resulting from a multiplication of the first matrix values and the second matrix values.

10. The method of claim 9, wherein selecting to operate in the first operating mode or the second operating mode is based on at least one of a first sparseness of the first matrix values or a second sparseness of the second matrix values as compared to a third sparseness of the third matrix values.

11. The method of claim 9, wherein selecting to operate in the first operating mode or the second operating mode is based on a first complexity value corresponding to applying the first matrix values and the second matrix values in a parallel computing system as compared to a second complexity value corresponding to applying the third matrix values in the parallel computing system.

12. The method of claim 9, further comprising one of:
configuring the quotient processing unit to perform arithmetic operations based on the first matrix values and configuring the first remainder processing unit to perform arithmetic operations based on the second matrix values when the first operating mode is selected; and
configuring the first remainder processing unit to perform arithmetic operations based on the third matrix values when the second operating mode is selected.

13. The method of claim 8, further comprising:
receiving a second divisor; and
in response to receiving the second divisor, selecting to operate in the first operating mode or the second operating mode at least partially based on a value of the second divisor.

14. The method of claim 1, wherein the divisor represents a generator function of a Bose-Chaudhuri-Hocquenghem (BCH) encoder, a Reed-Solomon (RS) encoder, or a cyclic code encoder.

15. The method of claim 1, further comprising, during the at least one stage of the multi-stage polynomial division operation:
performing a quotient processing operation at a quotient processing unit and providing an output of the quotient processing unit to a pipeline buffer during a first pipeline stage; and
performing a first remainder processing operation at a first remainder processing unit that accesses the pipeline buffer and generates a remainder value during a second pipeline stage.

16. The method of claim 15, further comprising:
appending one or more zero values to the portion of the received codeword, wherein a number of the appended zero values is determined based on the first number;
providing the portion of the codeword and the appended zero values to the quotient processing unit during a first pipeline cycle;
appending the one or more zero values to next sequential portion of the codeword; and
providing the next sequential portion of the codeword and the appended zero values to the quotient processing unit during a second pipeline cycle.

17. The method of claim 16, further comprising:
applying a first remainder value corresponding to the portion of the codeword and the appended zero values to a first portion of a remainder register; and
applying a second remainder value corresponding to the next sequential portion of the codeword and the appended zero values to a second portion of the remainder register, wherein the first portion of the remainder register and the second portion of the remainder register partially overlap.

18. The method of claim 15, wherein the quotient processing operation is performed on a received input dividend having number of dividend terms equal to the second number,
wherein the output of the quotient processing unit that is provided to the pipeline buffer includes a number of quotient terms equal to the second number, wherein the first remainder processing operation is performed on the output of the quotient processing unit received from the pipeline buffer, and wherein the remainder value includes a number of remainder terms equal to the second number.

19. The method of claim 15, wherein performing the quotient processing operation during the at least one stage of the multi-stage polynomial division operation is initiated during a first pipeline cycle, wherein the remainder value is generated during a second pipeline cycle that occurs after the first pipeline cycle, and further comprising:

during the second pipeline cycle, initiating a second quotient processing operation based on an adjusted second portion of the received codeword; and during a third pipeline cycle that occurs after the second pipeline cycle, initiating a third quotient processing operation based on an adjusted third portion of the received codeword, wherein the remainder value that is generated during the second pipeline cycle is used to generate the adjusted third portion of the received codeword but is not used to generate the adjusted second portion of the received codeword.

20. The method of claim 19, further comprising performing a polynomial addition operation of a third portion of the received codeword and at least a portion of the remainder value to generate the adjusted third portion of the received codeword.

21. The method of claim 19, further comprising concatenating a third portion of the received codeword and at least a portion of the remainder value to generate the adjusted third portion of the received codeword.

22. A polynomial division apparatus comprising:

a first remainder processing unit; and a second remainder processing unit;

wherein during at least one stage of a multi-stage polynomial division operation:

the first remainder processing unit is operable to perform low order bit processing to produce a low order bit remainder output; and the second remainder processing unit is operable to perform high order bit processing to produce a high order bit remainder output.

23. The apparatus of claim 22, further comprising:

a first register to store a portion of a received codeword, the portion of the received codeword having a first number of terms;

a second register to store a remainder value generated during the at least one stage based on a divisor value, the divisor value having a second number of terms; and an adder coupled to the first register and to the second register, wherein the adder is configured to adjust the portion of the received codeword with values from the second register based on a comparison of a first number representing the first number of terms to a second number representing the second number of terms.

24. The apparatus of claim 23, wherein the second remainder processing unit is configured to add at least one value of the high order bit remainder output to a value stored in the second register when the second number is greater than the first number.

25. The apparatus of claim 23, wherein the adder is configured to add a first portion of the remainder value to each of the terms of the portion of the received codeword when the first number is less than or equal to the second number and wherein the adder is configured to add a second portion of the remainder value to at least one but less than all of the terms of the portion of the received codeword when the first number is greater than the second number.

26. The apparatus of claim 23, further comprising a quotient processing unit that is programmable to perform arithmetic operations on the portion of the received codeword that has been adjusted, wherein the arithmetic operations are generated based on the divisor value.

27. The apparatus of claim 26, further comprising a configuration logic unit, wherein the configuration logic unit is adapted to determine whether to operate in one of a first operating mode and a second operating mode at least partially based on the divisor value, wherein in the first operating mode the adjusted portion of the codeword is received at the quotient processing unit and an output of the quotient processing unit is provided to the first remainder processing unit, and wherein in the second operating mode the quotient processing unit is bypassed and the adjusted portion of the codeword is provided to the first remainder processing unit.

28. The apparatus of claim 27, further comprising a unit programming module that is responsive to the divisor value and adapted to program at least one of the quotient processing unit and the first remainder processing unit without performing a lookup operation to retrieve stored data corresponding to the divisor value.

29. The apparatus of claim 27, further comprising a pipeline buffer coupled to receive an output of the quotient processing unit during a first pipeline cycle and to provide the output of the quotient processing unit to the first remainder unit during a subsequent pipeline cycle.

30. The apparatus of claim 22, wherein the first remainder processing unit and the second remainder processing unit are embedded within a controller of a non-volatile memory device.

31. The apparatus of claim 22, wherein the first remainder processing unit and the second remainder processing unit are embedded within an encoder of a data communication system.

32. The apparatus of claim 31, wherein the data communication system is a wireless communication system.

33. The apparatus of claim 22, wherein the first remainder processing unit and the second remainder processing unit are embedded within a decoder of a secure processor.

34. The apparatus of claim 33, wherein the secure processor is a cryptographic processor.

35. A polynomial division apparatus comprising:

a quotient processing unit adapted to perform a partial quotient determination operation of a codeword based on a divisor value;

a first remainder processing unit adapted to generate a remainder output; and a configuration logic unit, wherein the configuration logic unit is adapted to determine whether to operate in one of a first operating mode and a second operating mode at least partially based on the divisor value, wherein in the first operating mode an input dividend is received at the quotient processing unit and an output of the quotient processing unit is provided to the first remainder processing unit, and wherein in the second operating mode the quotient processing unit is bypassed and the input dividend is received at the first remainder processing unit.

36. The apparatus of claim 35, wherein in the first operating mode the quotient processing unit is programmed to implement a first set of polynomial operations and the first remainder processing unit is programmed to implement a second set of polynomial operations, and wherein in the second operating mode the first remainder processing unit is programmed to implement a third set of polynomial operations.

37. The apparatus of claim 35, wherein in the first operating mode the quotient processing unit is programmed to implement a first matrix operation and the first remainder processing unit is programmed to implement a second matrix operation, and wherein in the second operating mode the first remainder processing unit is programmed to implement a third matrix operation.

38. The apparatus of claim 37, wherein the configuration logic unit is responsive to a sparseness of a matrix representation of values based on the divisor value.

39. The apparatus of claim 35, further comprising:
   a first register to store at least a portion of the codeword; and
   a second register to store at least a portion of the remainder output,
   wherein the input dividend represents the at least a portion of the codeword that is adjusted based on values stored at the second register.

40. The apparatus of claim 35, further comprising a second remainder processing unit, wherein during at least one stage of a multi-stage polynomial division operation:
   the second remainder processing unit is operable to perform high order bit processing to produce a high order bit remainder output; and
   the first remainder processing unit is operable to perform low order bit processing to produce a low order bit remainder output.

41. The apparatus of claim 40, further comprising a first adder having a first input coupled to the first register, a second input coupled to the second register, and an output coupled to provide the input dividend to at least one of the first remainder processing unit and the quotient processing unit.

42. The apparatus of claim 41, wherein the second remainder processing unit includes a second adder having a first input coupled to at least a portion of an output of the first remainder processing unit, a second input coupled the second register, and an output coupled to the second register.

43. The apparatus of claim 35, wherein the quotient processing unit, the first remainder processing unit, and the configuration logic unit are implemented via hardware elements.

44. The apparatus of claim 43, wherein the quotient processing unit, the first remainder processing unit, and the configuration logic unit are within an integrated circuit.

* * * * *